(12) United States Patent
Komai

(10) Patent No.: US 7,427,877 B2
(45) Date of Patent: Sep. 23, 2008

(54) LEVEL SHIFT CIRCUIT, AND ACTUATOR APPARATUS AND OPTICAL SWITCH SYSTEM USING SAME

(75) Inventor: Atsushi Komai, Tokorozawa (JP)

(73) Assignee: Nikon Corporation, Tokyo (JP)

( * ) Notice: Subject to any disclaimer, the term of this patent is extended or adjusted under 35 U.S.C. 154(b) by 154 days.

(21) Appl. No.: 11/450,234

(22) Filed: Jun. 8, 2006

(65) Prior Publication Data
US 2006/0226876 A1 Oct. 12, 2006

Related U.S. Application Data

(63) Continuation of application No. PCT/JP2004/018868, filed on Dec. 10, 2004.

(30) Foreign Application Priority Data
Dec. 18, 2003 (JP) ............................. 2003-421673

(51) Int. Cl.
*H03K 19/0175* (2006.01)
*H03L 5/00* (2006.01)
(52) U.S. Cl. ............................. 326/68; 326/63; 326/81; 327/333
(58) Field of Classification Search .................. 326/62, 326/63, 68, 80, 81
See application file for complete search history.

(56) References Cited

U.S. PATENT DOCUMENTS

| 4,080,539 A * | 3/1978 | Stewart | 326/81 |
|---|---|---|---|
| 5,115,434 A * | 5/1992 | Aizaki | 326/81 |
| 5,296,757 A * | 3/1994 | Koizumi | 326/21 |
| 5,541,546 A * | 7/1996 | Okumura | 327/333 |
| 5,903,142 A * | 5/1999 | Mann | 323/313 |
| 6,163,170 A * | 12/2000 | Takinomi | 326/81 |
| 6,784,719 B2 * | 8/2004 | Okamoto et al. | 327/333 |
| 2002/0039042 A1 * | 4/2002 | Jinzai | 327/333 |
| 2007/0222478 A1 * | 9/2007 | Chen et al. | 326/80 |

FOREIGN PATENT DOCUMENTS

| JP | 4-178016 | 6/1992 |
|---|---|---|
| JP | 6-188718 | 7/1994 |
| JP | 2544815 | 7/1996 |
| JP | 2001-42233 | 2/2001 |
| JP | 2001-203326 | 7/2001 |
| JP | 2003-334798 | 11/2003 |

* cited by examiner

*Primary Examiner*—Rexford Barnie
*Assistant Examiner*—Thienvu V Tran
(74) *Attorney, Agent, or Firm*—Klarquist Sparkman, LLP

(57) ABSTRACT

A level shift circuit that shifts both the high potential level and the low potential level of an input voltage, a micro actuator and an optical switch using such a level shift circuit are disclosed. A CMOS inverter 11 connected to a +5 V power source and a 0 V power source provides, in response to an input signal, an output voltage whose H level is +5 V and whose L level is 0 V. A single channel MOS inverter 12 connected to a +15 V power source and the 0 V power source provides, in response to the output voltage of the CMOS inverter 11, an output voltage whose H level is +15 V and whose L level is 0 V. A single channel MOS inverter 13 connected to the +15 V power source and a −15 V power source provides an output voltage whose H level is +15 V and whose L level is −15 V. The inverter 12 has an NMOS transistor Q4 as a drive element. The inverter 13 has a PMOS transistor Q5 of the opposite conduction type as a drive element.

32 Claims, 16 Drawing Sheets

FIG. 21A  Vp  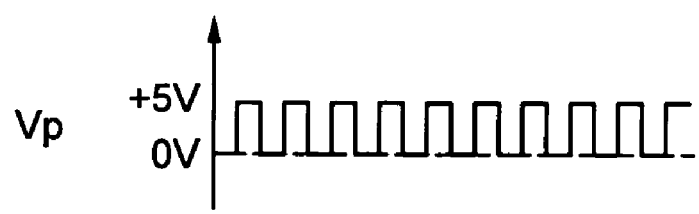
FIG. 21B  Va  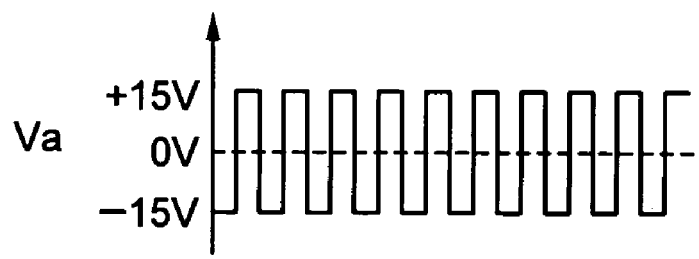
FIG. 21C  Vb  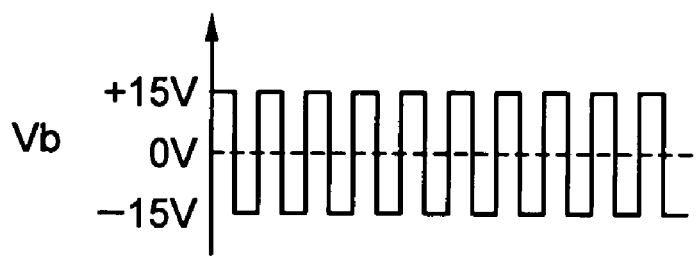

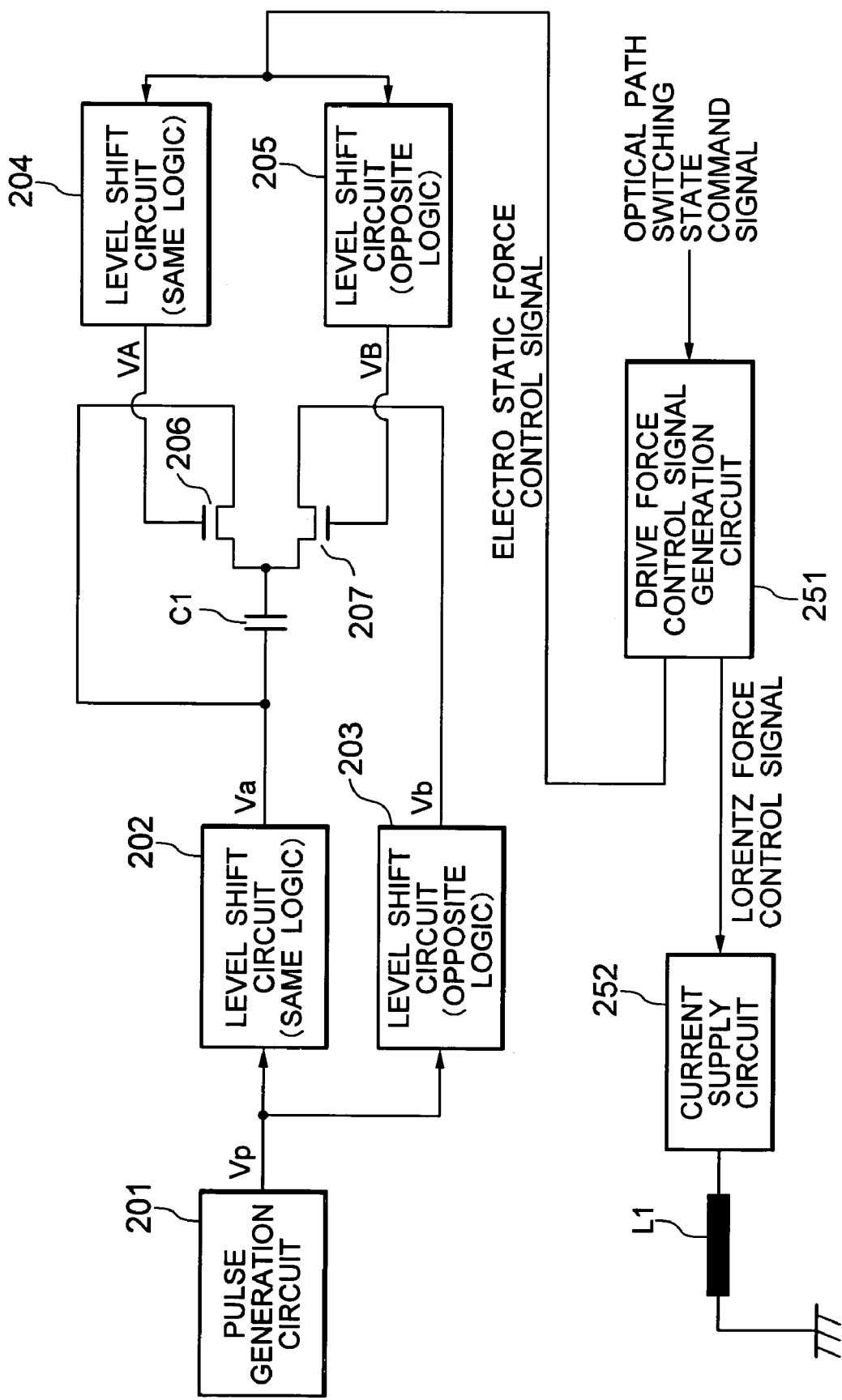

LEVEL SHIFT CIRCUIT, AND ACTUATOR APPARATUS AND OPTICAL SWITCH SYSTEM USING SAME

CROSS REFERENCE TO RELATED APPLICATION

This application is a continuation of, and claims a priority benefit under 35 U.S.C. §120 from, corresponding international application no. PCT/JP2004/018868, filed Dec. 10, 2004, and published as WO 2005/060102, which is incorporated by reference herein in its entirety.

TECHNICAL FIELD

The present invention relates to a level shift circuit that converts the voltage value of an input signal into a different voltage value and outputs it, and an actuator apparatus and an optical switch system using such a level shift circuit.

BACKGROUND ART

Japanese Patent No. 2544815 discloses a level shift circuit monolithically formed in a one-chip IC that can shift both the high voltage level and the low voltage level of an input voltage.

This prior art level shift circuit includes an initial stage circuit portion, a first intermediate stage circuit portion, a second intermediate stage circuit portion and a final stage circuit portion and is formed monolithically in a one-chip semiconductor integrated circuit. The first stage circuit portion includes an inverter connected to a first high potential power source (+5 V) and a first low potential power source (0 V) and provides, in response to an input signal, an output voltage whose H level is the voltage level of the first high potential power source (+5V) and whose L level is the voltage level of the first low potential power source (0 V). The first intermediate stage circuit portion includes an inverter connected to the first high potential power source (+5 V) and a second low potential power source (−10 V) having a voltage level lower than the voltage level (0 V) of the first low potential power source and provides, in response to the output voltage of the first stage circuit portion, an output voltage having the logic state opposite to the input signal with the H level being the voltage level of the first high potential power source (+5 V) and the L level being the voltage level of the second low potential power source (−10V). The second intermediate state circuit portion includes an inverter connected to a second high potential power source (+10 V) having a voltage level higher than the first high potential power source (+5 V) and the first low potential power source and provides, in response to the output voltage of the first stage circuit portion, an output voltage having the logic state opposite to the input signal with the H level being the voltage level of the second high potential power source (+10 V) and the L level being the voltage level of the first low potential power source (0 V). The final stage circuit portion includes an inverter connected to the second high potential power source (+10 V) and the second low potential power source (−10 V) and provides, in response to the output voltage of the first intermediate stage circuit portion and the output voltage of the second intermediate circuit portion, an output voltage having the logic state same as the input signal with the H level being the voltage level of the second high potential power source (+10 V) and the L level being the voltage level of the second low potential power source (−10 V).

With development of micro-machining techniques, the importance of actuators has been growing in various fields. An example of the fields in which micro-actuators are used is an optical switch that is used in optical communications, etc., to switch optical paths. Such optical switches are disclosed for example, in Japanese Patent Application Laid-Open Nos. 2001-42233 and 2003-334798.

In the optical switches disclosed in Japanese Patent Application Laid-Open Nos. 2001-42233 and 2003-334798, micro-actuators for moving micro mirrors are used. The micro-actuator has a movable portion that is movable relative to a fixed portion, and the movable portion is adapted to be returned to its upper position (at which the micro mirror can reflect incident light) by a spring. In addition, a first electrode portion (fixed electrode) is provided on the fixed portion, and a second electrode (movable electrode) is provided on the movable portion. A voltage is applied between the first and the second electrodes to generate an electrostatic force between them, whereby the movable portion is brought to its lower position at which the micro mirror leaves incident light to pass while intact and maintained at that position. When application of the voltage between the first and the second electrodes is stopped, the movable portion is returned to its upper position by the spring.

The level shift circuit disclosed in Japanese Patent No. 2544815 includes two circuit portions in the intermediate stage (i.e., the first and the second intermediate circuit portions), and a large number of elements such as MOS transistors are needed in that circuit. Accordingly, it has been difficult to miniaturize it, and it has suffered from low production yields.

Furthermore, the level shift circuit is required to have a relatively large difference between the high potential level and the low potential level of the input voltage in some cases depending on the use. In such cases, the level shift circuit is required to have a high withstand voltage. For example, in the case where a level shift circuit is used, in order to control a micro actuator utilizing an electrostatic force like those adopted in the optical switches disclosed in Japanese Patent Application Laid-Open Nos. 2001-42233 and 2003-334798, to supply a voltage between the movable electrode and the fixed electrode, a relatively high voltage is required, and therefore the level shift circuit is required to have a relatively high withstand voltage.

Furthermore, the level shift circuit is demanded to be simple in the structure and easy to manufacture as is the case with typical semiconductor devices.

DISCLOSURE OF THE INVENTION

The present invention has been made in view of the above described circumstances and has as an object to provide a level shift circuit that can shift both the high potential level and the low potential level of an input voltage, can be constructed by a small number of elements, is simple in its structure, is easy to miniaturize, is easy to improve in terms of withstand voltage, and is easy to manufacture. In addition, it is also an object of the present invention to provide a micro actuator and an optical switch using such a level shift circuit.

To achieve the above object, a level shift circuit according to a first aspect of the present invention comprises: (a) a first circuit portion including a CMOS inverter connected to a first high potential power source and a first low potential power source to provide, in response to an input signal, an output voltage whose H level is equal to or close to the voltage level of said first high potential power source and whose L level is equal to or close to the voltage level of said first low potential power source, (b) a second circuit portion including a first single channel MOS inverter connected to a second high potential power source having a voltage level higher than the voltage level of said first high potential power source and said first low potential power source to provide, in response to the output voltage of said first circuit portion, an output voltage whose H level is equal to or close to the voltage level of said second high potential power source and whose L level is equal to or close to the voltage level of said first low potential power source, and (c) a third circuit portion including a second single channel MOS inverter connected to said second high potential power source and a second low potential power source having a voltage level lower than said first low potential power source to provide, in response to the output voltage of said second circuit portion, an output voltage whose H level is equal to or close to the voltage level of said second high potential power source and whose L level is equal to or close to the voltage level of said second low potential power source. Said first single channel MOS inverter has an NMOS transistor as a drive element, and said second single channel MOS inverter has a PMOS transistor as a drive element.

According to a second aspect of the present invention, in the level shift circuit according to the first aspect of the invention, a fourth circuit portion including an inverter for causing the output voltage of the level shift circuit to have the same logic state as said input signal is further provided.

According to a third aspect of the present invention, in the level shift circuit according to the second aspect, said inverter included in said fourth circuit portion is connected to said second high potential power source and said second low potential power source, said fourth circuit portion provides, in response to the output voltage of said third circuit portion, an output voltage whose H level is equal to or close to the voltage level of said second high potential power source and whose L level is equal to or close to the voltage level of said second low potential power source, and said inverter included in said fourth circuit portion is a third single channel MOS inverter having a PMOS transistor as a drive element.

According to a fourth aspect of the present invention, in the level shift circuit according to any one of the first to third aspects, said circuit portions are provided on a semiconductor substrate.

According to a fifth aspect of the present invention, in the level shift circuit according to the fourth aspect, the drain and the source of an NMOS transistor included in said CMOS inverter and the source and the drain of an NMOS transistor included in said first single channel MOS inverter are provided in a P-type semiconductor region, the drain and the source of a PMOS transistor included in said CMOS inverter is provided in a first N-type well, and the drain and the source of an PMOS transistor included in said second single channel MOS inverter is provided in a second N-type well that is different from said first N-type well. Said first N-type well and said second N-type well may be formed simultaneously by the same process. It is preferred that they are formed simultaneously, since the manufacturing process can be made simple.

A micro actuator apparatus according to a sixth aspect of the present invention comprises a micro actuator having a fixed portion and a movable portion adapted to be movable relative to the fixed portion and a control means for controlling said micro actuator, wherein said fixed portion includes a first electrode portion, said movable portion includes a second electrode portion that can generate an electrostatic force by a voltage applied between it and said first electrode portion, and said control means includes the level shift circuit according to any one of the first to fifth aspects and supplies a desired voltage between said first electrode and said second electrode based on the output voltage of that level shift circuit.

An optical switch system according to a seventh aspect of the present invention comprises the micro actuator apparatus according to the sixth aspect and a mirror provided on said movable portion of said micro actuator.

As will be described in the following, according to the present invention it is possible to provide a level shift circuit that can shift both the high potential level and the low potential level of an input voltage, can be constructed by a small number of elements, is simple in its structure, is easy to miniaturize, is easy to improve in terms of withstand voltage, and is easy to manufacture. It is also possible to provide a micro actuator and an optical switch using such a level shift circuit.

BRIEF DESCRIPTION OF THE DRAWINGS

FIGS. 21A, 21B and 21C show signal waveforms at some portions in FIG. 20.

FIG. 23 is a circuit diagram of a control circuit in the fourth embodiment of the present invention.

THE BEST MODE FOR CARRYING OUT THE INVENTION

In the following, a level shift circuit, and an actuator apparatus and an optical switch system that use the level shift circuit according to the present invention will be described with reference to the drawings.

First Embodiment

Figure 1:
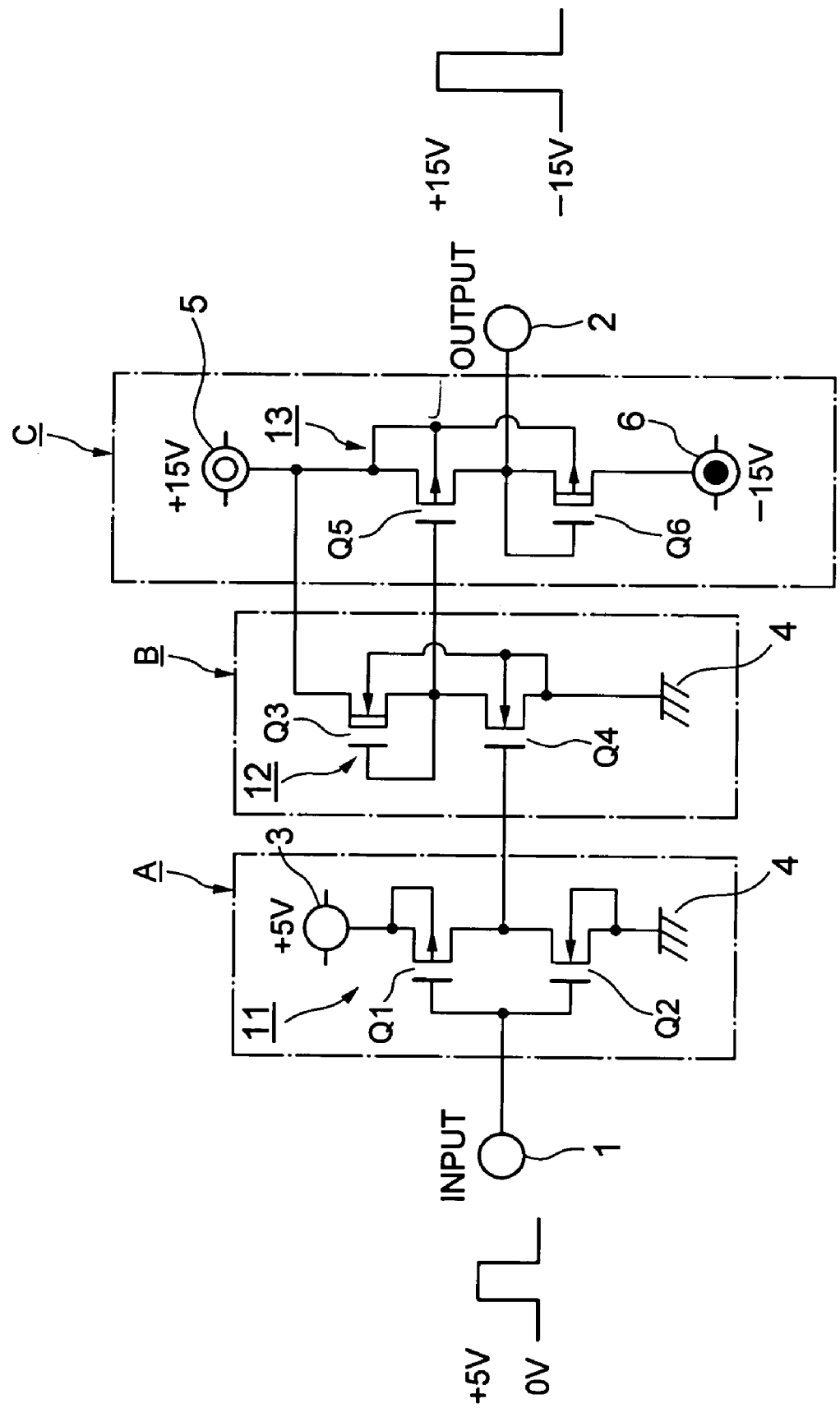
FIG. 1 is an electric circuit diagram of a level shift circuit according to a first embodiment of the present invention.

FIG. 1 is an electric circuit diagram showing a level shift circuit according to a first embodiment of the present invention.

As shown in FIG. 1, the level shift circuit according to this embodiment includes an input terminal 1 for receiving an input voltage of 0 V to +5 V as an input signal, an output terminal 2 for outputting an output voltage of +15 V to −15 V as an output signal after level shift, the first circuit portion A including a CMOS inverter 11, the second circuit portion B including a first single channel MOS inverter 12 and the third circuit portion C including a second single channel MOS inverter 13.

In this embodiment, the first circuit portion A is composed of one CMOS inverter 11. The CMOS inverter 11 is composed of a PMOS transistor Q1 and an NMOS transistor Q2.

The source of the PMOS transistor Q1 is connected to a high potential power source 3 (first high potential power source) of +5 V. The drain of the PMOS transistor Q1 is connected to the drain of the NMOS transistor Q2. The source of the NMOS transistor Q2 is connected to a low potential power source 4 (first low potential power source) of 0 V (namely, grounded). The gate of the PMOS transistor Q1 and the gate of the NMOS transistor Q2 are connected to the input terminal 1. The connection point of the drain of the PMOS transistor Q1 and the drain of the NMOS transistor Q2 constitutes the output terminal of the CMOS inverter 11 (that is, in this embodiment, the output terminal of the first circuit portion A), which is connected to the gate of the later described NMOS transistor Q4 of the second circuit portion B (that is, in this embodiment, the input terminal of the second circuit portion B). The region of the PMOS transistor Q1 that is opposed to the gate (i.e., the region constituting the channel) is connected to the +5 V high potential power source 3. The region of the NMOS transistor Q2 that is opposed to the gate is connected to the 0 V low potential power source 4. The threshold value of the PMOS transistor Q1 is designed to be, for example, −1.5 V, and the threshold value of the NMOS transistor Q2 is designed to be, for example, +1.5 V.

In this embodiment, the second circuit portion B is composed of one single channel MOS inverter 12. The single channel MOS inverter 12 is composed of a depletion type NMOS transistor Q3 functioning as a load and an enhancement type NMOS transistor Q4 functioning as a drive element. Alternatively, in the single channel MOS inverter 12, an enhancement type NMOS transistor or a resistor may be used as a load in place of the depletion type NMOS transistor Q3.

The drain of the NMOS transistor Q3 is connected to a high potential power source 5 (second high potential power source) of +15 V. The source of the NMOS transistor Q3 is connected to the drain of the NMOS transistor Q4. The source of the NMOS transistor Q4 is connected to the 0 V low potential power source 4 (first low potential power source). The gate of the NMOS transistor Q3 is connected to the connection point of the source of the NMOS transistor Q3 and the drain of the NMOS transistor Q4. The gate of the NMOS transistor Q4 constitutes the input terminal of the single channel MOS inverter 12 (that is, in this embodiment, the input terminal of the second circuit portion B), which is connected to the output terminal of the first circuit portion A, as described above. The connection point of the source of the NMOS transistor Q3 and the drain of the NMOS transistor Q4 constitutes the output terminal of the single channel MOS inverter 12 (that is, in this embodiment, the output terminal of the second circuit portion B), which is connected to the gate of the later described PMOS transistor Q5 of the third circuit portion C (that is, in this embodiment, the input terminal of the third circuit portion C). The region of the NMOS transistor Q3 that is opposed to the gate and the region of the NMOS transistor Q4 that is opposed to the gate are connected to the 0 V low potential power source 4. The threshold value of the NMOS transistor Q3 is designed to be, for example, −3.3 V, and the threshold value of the NMOS transistor Q4 is designed to be, for example, +1.2 V.

In this embodiment, the third circuit portion C is composed of one single channel MOS inverter 13. The single channel MOS inverter 13 is composed of an enhancement type PMOS transistor Q5 functioning as a drive element and a depletion type PMOS transistor Q6 functioning as a load. Alternatively, in the single channel MOS inverter 13, an enhancement type PMOS transistor or a resistor may be used as a load in place of the depletion type PMOS transistor Q6.

The source of the PMOS transistor Q5 is connected to the high potential +15 V power source 5 (second high potential power source). The drain of the PMOS transistor Q5 is connected to the source of the PMOS transistor Q6. The drain of the PMOS transistor Q6 is connected to a low potential power source 6 (second lower potential power source) of −15 V. The gate of the PMOS transistor Q5 constitutes the input terminal of the single channel MOS inverter 13 (that is, in this embodiment, the input terminal of the third circuit portion C), which is connected to the output terminal of the second circuit potion B as described above. The gate of the PMOS transistor Q6 is connected to the connection point between the drain of the PMOS transistor Q5 and the source of the PMOS transistor Q6. The connection point between the drain of the PMOS transistor Q5 and the source of the PMOS transistor Q6 constitutes the output terminal of the single channel MOS inverter 13 (that is, in this embodiment, the output terminal of the third circuit potion C), which is connected to the output terminal 2. The region of the PMOS transistor Q5 that is opposed to the gate and the region of the PMOS transistor Q6 that is opposed to the gate are connected to the +15 V high potential power source 5. The threshold value of the PMOS transistor Q5 is designed to be, for example, −3.0 V and the threshold value of the PMOS transistor Q6 is designed to be, for example, +5.0 V.

In the following, the operation of the level shift circuit according to this embodiment will be described.

When an input signal of the L level 0 V is applied to the input terminal 1, the PMOS transistor Q1 is brought to the on state and the NMOS transistor Q2 is brought to the off state, and therefore the voltage +5 V (H level) of the first high potential power source 3 is output from the first circuit portion A and input to the second circuit portion B.

Consequently, since the voltage +5 V is applied to the gate of the NMOS transistor Q4 in the second circuit portion B, the NMOS transistor Q4 is brought to the on state, and a voltage close to the voltage 0 V (nearly 0 V: L level) of the first low potential power source is output from the second circuit portion B and input to the third circuit portion C. The NMOS transistor Q3 that serves as the load in the single channel MOS inverter 12 keeps the on state.

As a result, in the third circuit portion C, since a voltage of nearly zero volt is applied to the gate of the PMOS transistor Q5, the PMOS transistor Q5 is brought to the on state, and a voltage close to the voltage +15 V (nearly +15 V: H level) of the second high potential power source 5 is output at the output terminal 2. In connection with this, the PMOS transistor Q6 that serves as the load in the single channel MOS inverter 13 keeps the on state.

On the other hand, when an input signal of the H level +5 V is applied to the input terminal 1, all the logic states of the above described operation are inverted, that is: the PMOS transistor Q1 is brought to the off state, and the NMOS transistor Q2 is brought to the on state, whereby the L level (0 V) is output from the first circuit portion A; the NMOS transistor Q3 keeps the on state, and the NMOS transistor Q4 is brought to the off state, whereby the H level (+15 V) is output from the second circuit portion B; and the PMOS transistor Q6 keeps the on state, and the PMOS transistor Q5 is brought to the off state, whereby the L level (nearly −15 V) is output from the third circuit C at the output terminal 2.

In this way, for input voltages of 0 V to +5 V applied on the input terminal 1, output voltages of +15 V to −15 V, which have been shifted in terms of both the high and low potentials, having the logic states opposite to the input voltages are obtained at the output terminal 2.

In contrast to the conventional level shift circuit disclosed in Japanese Patent No. 2544815 that requires two intermediate stage circuit portions (i.e. the first and the second intermediate stage circuit portions), the circuit of this embodiment includes, in the intermediate stage, only one circuit portion B composed of a single channel MOS inverter B, and the number of the elements is much smaller than the conventional level shift circuit disclosed in Japanese Patent No. 2544815. Therefore, according to this embodiment, it is possible to miniaturize the circuit easily as compared to the conventional level shift circuit disclosed in patent document 1, and the yield is increased.

Figure 2:
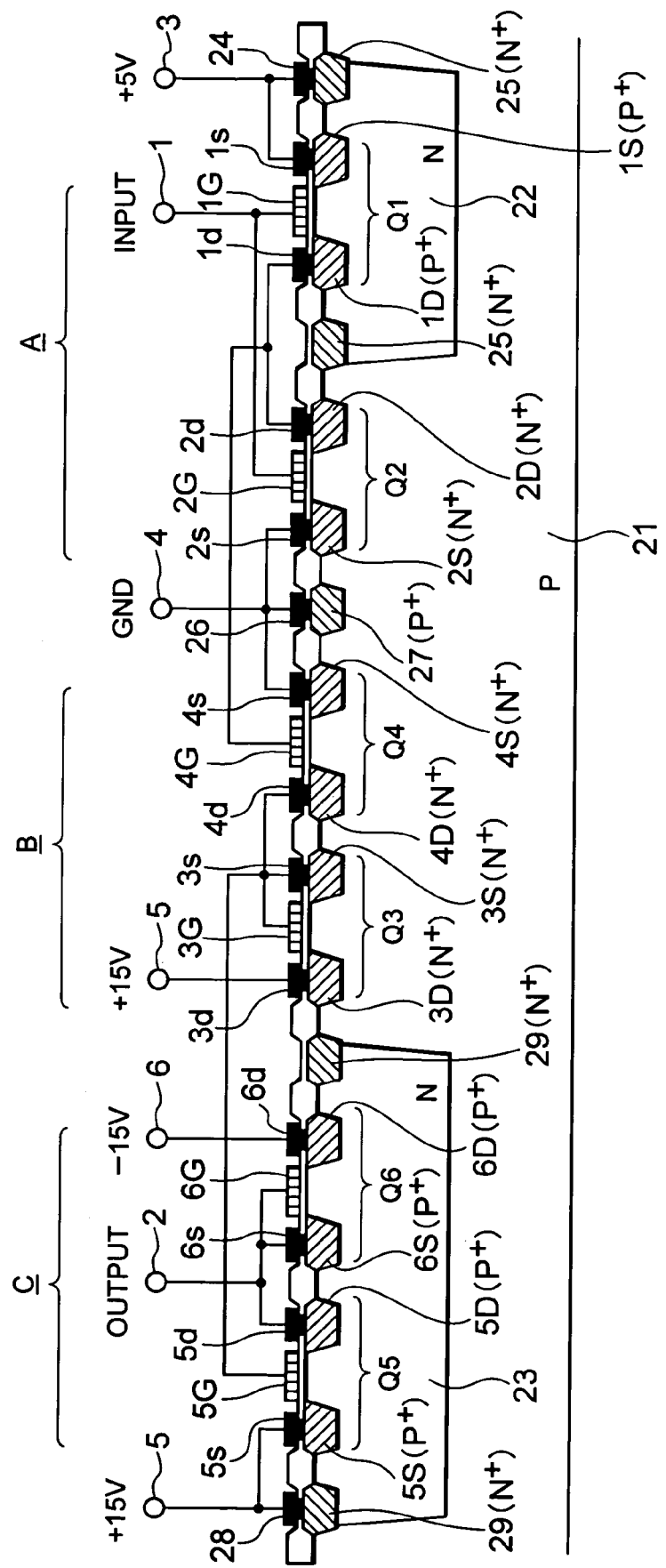
FIG. 2 is a schematic cross sectional view showing an exemplary structure of the level shift circuit according to the first embodiment of the present invention.

Here, an example of the structure of the level shift circuit according to this embodiment will be described with reference to FIG. 2. FIG. 2 is a cross sectional view schematically showing such a structure.

As shown in FIG. 2, on the front side of a P-type semiconductor substrate 21, two different N-wells 22 and 23 are formed. In the N-well 22, there is provided the source ($P^+$-type diffusion region) 1S and the drain ($P^+$-type diffusion region) 1D of the PMOS transistor Q1. Also provided in the N-well 22 is an $N^+$-type diffusion region 25 for connecting the N-well 22 to the +5 V high potential power source 3 through an electrode 24. The source 1S of the PMOS transistor Q1 is connected to the electrode 24 through an electrode Is, namely connected to the +5 V high potential power source 3. The gate 1G of the PMOS transistor Q1 is connected to the input terminal 1 and the gate 2G of the NMOS transistor Q2. The drain 1D of the PMOS transistor Q1 is connected to the drain 2D of the NMOS transistor Q2 through-electrodes 1d and 2d, and also to the gate 4G of the NMOS transistor Q4.

On the front side of the P-type semiconductor substrate (or P-type semiconductor region) 21, there is provided the source ($N^+$-type diffusion region) 2S and the drain ($N^+$-type diffusion region) 2D of the NMOS transistor Q2, the source ($N^+$-type diffusion region) 3S and the drain ($N^+$-type diffusion region) 3D of the NMOS transistor Q3, and the source ($N^+$-type diffusion region) 4S and the drain ($N^+$-type diffusion region) 4D of the NMOS transistor Q4. Furthermore, a $P^+$-type diffusion region 27 for connecting the P-type semiconductor substrate 21 to the 0 V low potential power source (or ground) 4 through an electrode 26 is also provided in the front side of the P-type semiconductor substrate 21. The source 2S of the NMOS transistor Q2 is connected to the electrode 26 through an electrode 2s. The source 4S of the NMOS transistor Q4 is connected to the electrode 26 via an electrode 4s. Thus, each of the sources 2S, 4S is connected to the 0 V low potential power source 4. The drain 4D of the NMOS transistor Q4 is connected to the source 3S of the NMOS transistor Q3 through electrodes 4d and 3s, and also connected to the gate G3 of the NMOS transistor Q3 and the gate 5G of the PMOS transistor Q5. The drain 3D of the NMOS transistor Q3 is connected to the +15 V high potential power source 5 through an electrode 3d.

In the N-well 23, there is provided the source ($P^+$-type diffusion region) 5S and the drain ($P^+$-type diffusion region) 5D of the PMOS transistor Q5 and the source ($P^+$-type diffusion region) 6S and the drain ($P^+$-type diffusion region) 6D of the PMOS transistor Q6. Also provided in the N-well 23 is an $N^+$-type diffusion region 29 for connecting the N-well 23 to the +15 V high potential power source 5 through an electrode 28. The source 5S of the PMOS transistor Q5 is connected to the electrode 28 through an electrode 5s and to the +15 V high potential power source 5 accordingly. The drain SD of the PMOS transistor Q5 is connected to the source 6S of the PMOS transistor Q6 through electrodes 5d and 6s and also connected to the gate 6G of the PMOS transistor Q6 and the output terminal 2. The drain 6D of the PMOS transistor Q6 is connected to the −15 V low potential power source 6 through an electrode 6d.

As per the above, in the example shown in FIG. 2, the drain 2D and the source 2S of the NMOS transistor Q2 included in the CMOS inverter 11 of the first circuit portion A, and the drains 3D, 4D and the sources 3S, 4S of the NMOS transistors Q3, Q4 included in the single channel MOS inverter 13 of the second circuit portion B are aggregated in the same P-type semiconductor region (i.e. the P-type semiconductor substrate 21). The drain 1D and the source 1S of the PMOS transistor Q1 included in the CMOS inverter 11 of the first circuit portion A are provided in the first N-type well 22. Furthermore, the drains 5D, 6D and the sources 5S, 6S of the PMOS transistors Q5, Q6 included in the single channel MOS inverter 13 of the third circuit portion C are aggregated in the second N-type well 23 that is different from the first N-type well 22.

Accordingly, in the example shown in FIG. 2, a very few number of semiconductor regions are required, that is only three semiconductor regions (P-type semiconductor substrate 21, the N-well 22 and the N-well 23). In addition, although it is necessary to electrically separate the N-type well 22 and the N-type well 23, their structure may be the same in terms of production process, and they can be formed by a single well diffusion process. Therefore, the structure shown in FIG. 2 is so simple as to be manufactured easily, and in addition, it is easy to enhance its withstand voltage. Furthermore, the possibility of occurrence of latch-up is much decreased.

In this embodiment, the main reason why such a simple structure like that shown in FIG. 2 can be realized is that a single channel MOS inverter 12 having as a drive element an NMOS transistor Q4 is used as the inverter of the second circuit portion B, and in addition that a single channel MOS inverter 13 having as a drive element a PMOS transistor Q4 of the conduction type opposite to the NMOS transistor Q4 is used as the inverter of the third circuit portion C. For example, if in this embodiment the single channel MOS inverter 13 is replaced by a CMOS inverter, or the single channel MOS inverters 12 and 13 are replaced by CMOS inverters, the number of the semiconductor regions required increases disadvantageously, and/or a special separate diffusion region is required to be provided. The fact that simple structures like that shown in FIG. 2 can be realized by the use of the above described structure was discovered by a study made by the inventor of the present invention.

Needless to say, the values of the voltage levels of each of the power sources 3 to 6 are not limited to those indicated above.

Second Embodiment

Figure 3:
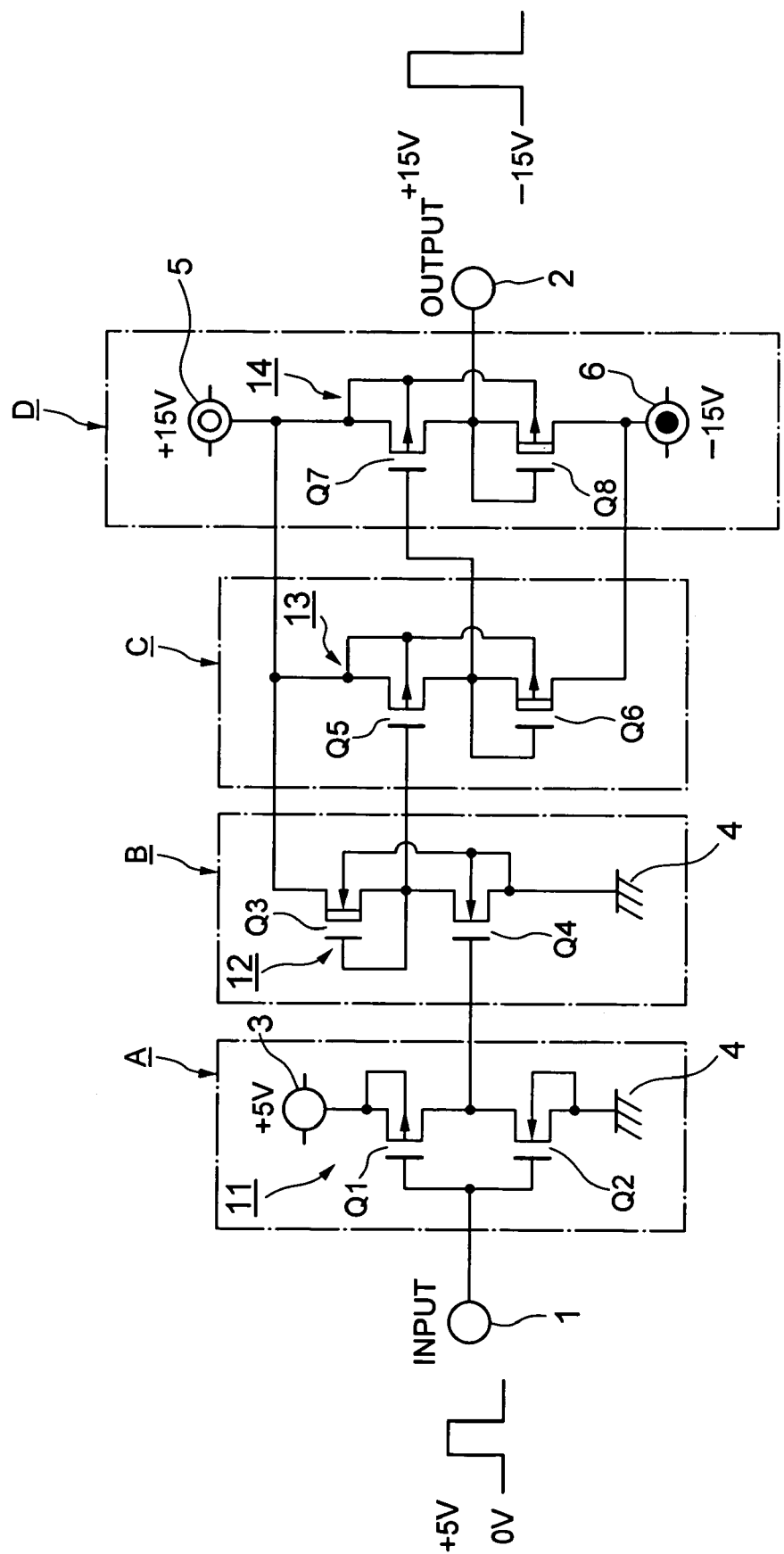
FIG. 3 is an electric circuit diagram of a level shift circuit according to a second embodiment of the present invention.

FIG. 3 is an electric circuit diagram showing a level shift circuit according to a second embodiment of the present invention. In FIG. 3, the elements same as or equivalent to those shown in FIG. 1 will be designated by the same reference signs, and redundant descriptions thereof will be omitted.

What is different in this embodiment from the above described first embodiment is only that a fourth circuit portion D is provided between the third circuit portion C and the output terminal 2.

In this embodiment, the fourth circuit portion D is composed of a single channel MOS inverter 14 having the same configuration as the single channel MOS inverter 13 of the third circuit portion C. Specifically, the single channel MOS inverter 14 is composed of an enhancement type PMOS transistor Q7 functioning as a drive element and a depletion type PMOS transistor Q8 functioning as a load. Alternatively, in the single channel MOS inverter 14, an enhancement type PMOS transistor or a resistor may be used as a load in place of the depletion type PMOS transistor Q8.

The source of the PMOS transistor Q7 is connected to the +15 V high potential power source (the second high potential power source) 5. The drain of the PMOS transistor Q7 is connected to the source of the PMOS transistor Q8. The drain of the PMOS transistor Q8 is connected to the −15 V low potential power source (the second low potential power source) 6. The gate of the PMOS transistor Q7 constitutes the input terminal of the single channel MOS inverter 14 (that is, in this embodiment, the input terminal of the fourth circuit portion D), and is connected to the output terminal of the third circuit portion C (that is, the output terminal of the single channel MOS inverter 13 or the connection point between the drain of the PMOS transistor Q5 and the source of the PMOS transistor Q6). The gate of the PMOS transistor Q8 is connected to the connection point between the drain of the PMOS transistor Q7 and the source of the PMOS transistor Q8. The connection point between the drain of the PMOS transistor Q7 and the source of the PMOS transistor Q8 constitutes the output terminal of the single channel MOS inverter 14 (that is, in this embodiment, the output terminal of the fourth circuit portion D) and is connected to the output terminal 2. The region of the PMOS transistor Q7 that is opposed to the gate and the region of the PMOS transistor Q8 that is opposed to the gate are connected to the +15 V high potential power source 5. The threshold value of the PMOS transistor Q7 is designed to be, for example, −3.0 V, and the threshold value of the PMOS transistor Q8 is designed to be, for example, +5.0 V.

According to the present invention, with the fourth circuit portion D, a voltage having the logic state opposite to the logic state of the output voltage of the third circuit portion C is output, and this voltage of the opposite logic state is supplied at the output terminal 2. Therefore, in contrast to the above described first embodiment in which an output voltage (+15 V to −15 V) having the logic state opposite to the logic state of the input voltage of 0 V to +5 V at the input terminal 1 is obtained at the output terminal 2, an output voltage (−15 V to +15 V) having the logic state same as the logic state of the input voltage of 0 V to +5 V at the input terminal 1 is obtained at the output terminal 2 in this embodiment. Therefore, the level shift circuit of this embodiment is suitable for applications in which the use is made of an output voltage having the same logic state as the input voltage.

This embodiment can also realize the advantageous effects same as those of the above described first embodiment.

Furthermore, in this embodiment, provision of the fourth circuit portion D will lead to the advantageous effect that the H level and the L level of the output voltage from the output terminal 2 can be precisely set to the +15 V voltage level of the second high potential power source 5 and the −15 V voltage level of the second low potential power source 6, respectively.

Figure 4:
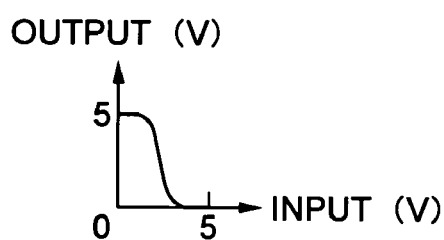
FIG. 4 is a graph showing an input-output characteristic of the first circuit portion in the first and the second embodiments.
Figure 5:
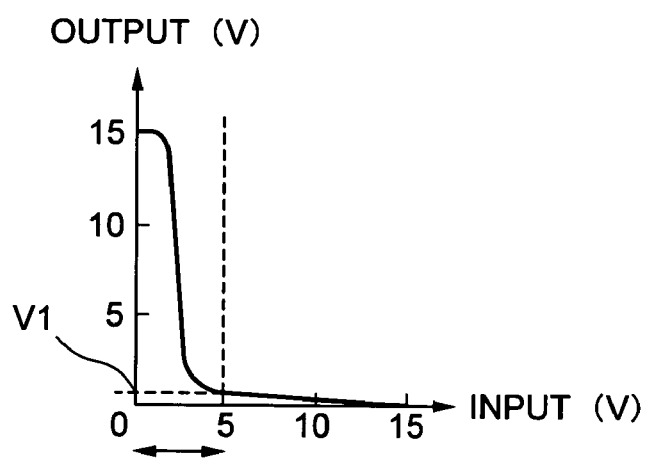
FIG. 5 is a graph showing an input-output characteristic of the second circuit portion in the first and the second embodiments.
Figure 6:
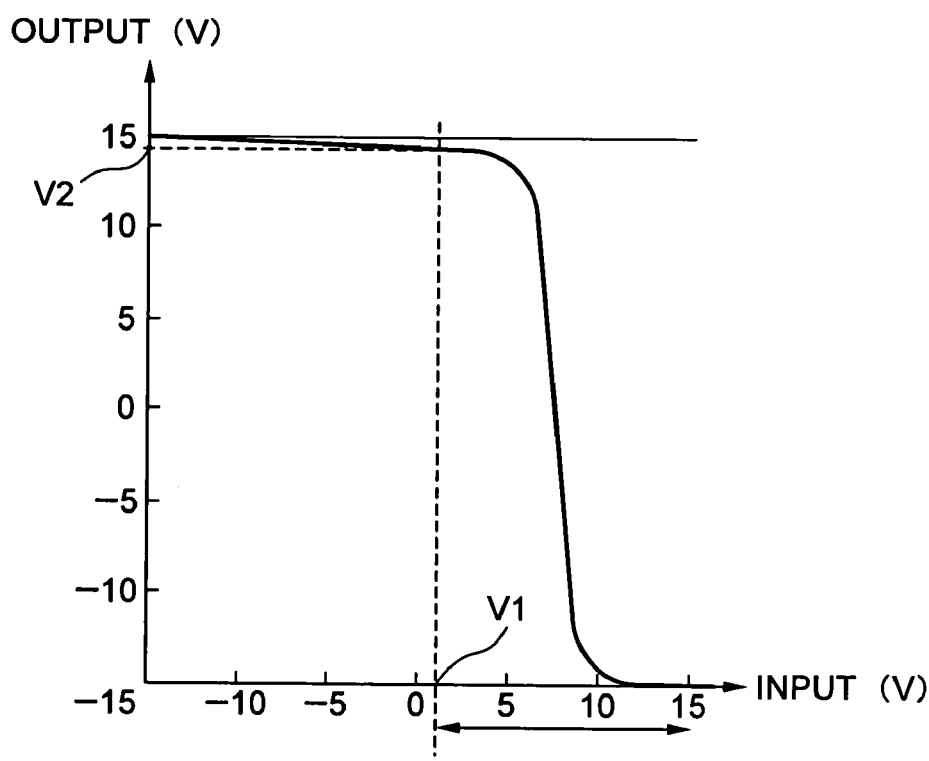
FIG. 6 is a graph showing an input-output characteristic of the third circuit portion in the first and the second embodiments.
Figure 7:
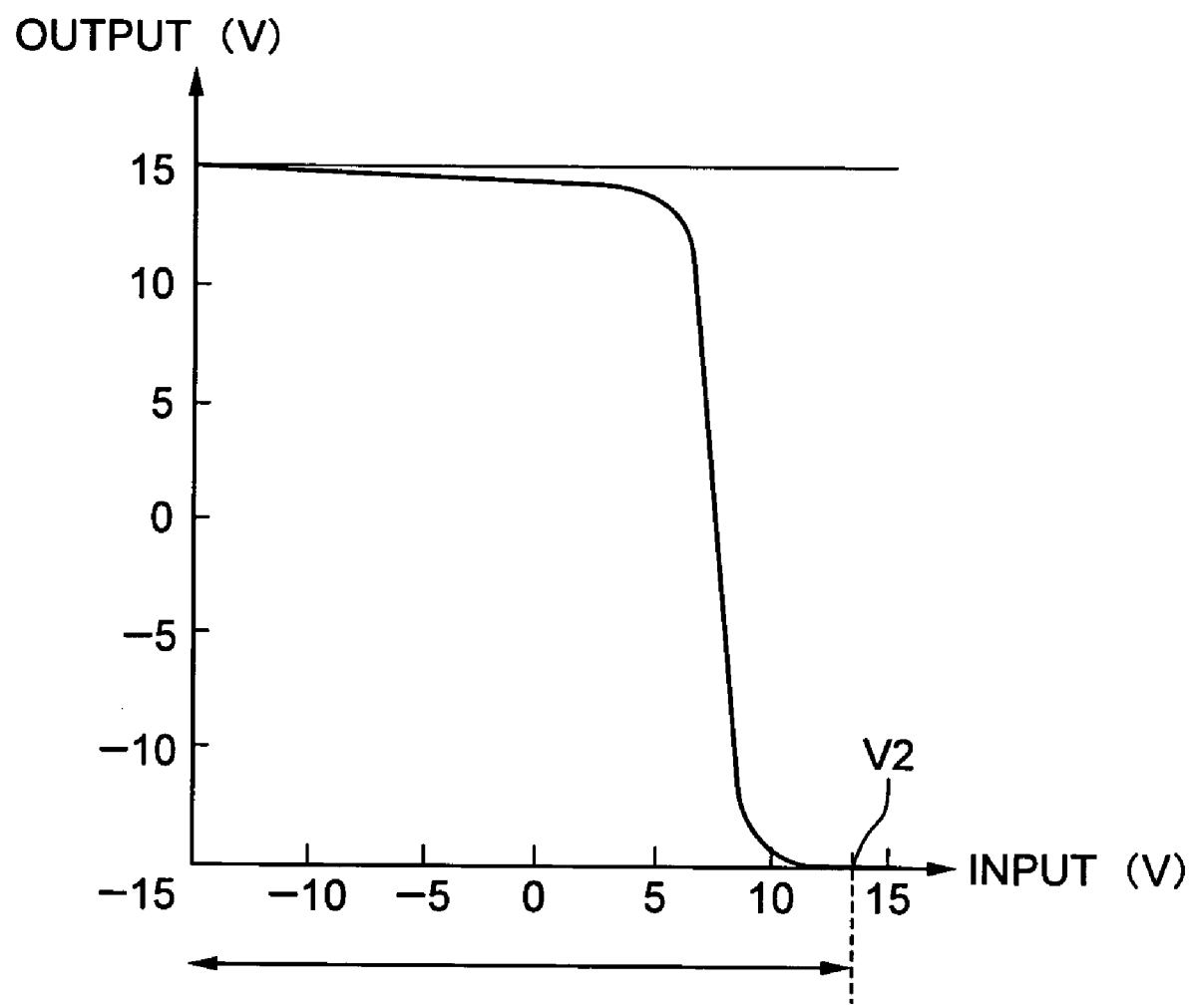
FIG. 7 is a graph showing an input-output characteristic of the fourth circuit portion in the second embodiments.

This will be discussed in the following with reference to FIGS. 4 to 7. FIG. 4 is a graph showing the input-output characteristic of the first circuit portion A in the first and the second embodiments. FIG. 5 is a graph showing the input-output characteristic of the second circuit portion B in the first and the second embodiments. FIG. 6 is a graph showing the input-output characteristic of the third circuit portion C in the first and the second embodiments. FIG. 7 is a graph showing the input-output characteristic of the fourth circuit portion D in the second embodiment.

The first circuit portion A is composed of the CMOS inverter 11 that is constructed as a non-ratio type inverter, and it has the input-output characteristic shown in FIG. 4. Accordingly, as will be understood from FIG. 4, for the input voltage range of the first circuit portion A (i.e., the range of the voltage applied to the input terminal 1) of 0 V to +5 V, the output voltage range of the first circuit portion A is 0 V to +5 V exactly.

The second circuit portion B is composed of the single channel MOS inverter 12 that is constructed as a ratio type inverter, and therefore it has the input-output characteristic shown in FIG. 5. Accordingly, as will be understood from FIG. 5, for the output voltage range of the first circuit portion A (i.e., the input voltage range of the second circuit portion B) of 0 V to +5 V, the output voltage range of the second circuit portion B is V1 to +15 V.

The third circuit portion C is composed of the single channel MOS inverter 13 that is constructed as a ratio type inverter, and therefore it has the input-output characteristic shown in FIG. 6. Accordingly, as will be understood from FIG. 6, for the output voltage range of the second circuit portion B (i.e., the input voltage range of the third circuit portion C) of V1 to +15 V, the output voltage range of the third circuit portion C is −15 V to V2.

Therefore, in the above described first embodiment, since the output voltage at the output terminal 2 is the output voltage of the third circuit portion C, the range of the output voltage at the output terminal 2 is −15 V to V2. Namely, the voltage level of the H level does not become exactly +15 V, but it becomes smaller by (15 V−V2).

The fourth circuit portion D is composed of the single channel MOS inverter 14 that is constructed as a ratio type inverter, and therefore it has the input-output characteristic shown in FIG. 7 (same as the input-output characteristic shown in FIG. 6). Since the input voltage range of the fourth circuit portion D (that is, the output voltage range of the third circuit portion C) is relatively large, (that is, −15 V to V2), its output voltage range is −15 V to +15 V exactly as will be seen from FIG. 7.

Therefore, the second embodiment has an additional advantage that the H level and the L level of the output voltage at the output terminal 2 can be exactly set to the voltage level +15 V of the second high potential power source 5 and the voltage level −15 V of the second low potential power source 6, respectively.

In the case where this advantage is not needed, in order to obtain an output voltage having the logic state same as the input voltage at the input terminal 1 while achieving the advantageous effects same as the above described first embodiment, the inverter may be arranged at any position. For example, the above described first embodiment may be modified as shown in FIG. 8 or FIG. 9.

Figure 8:
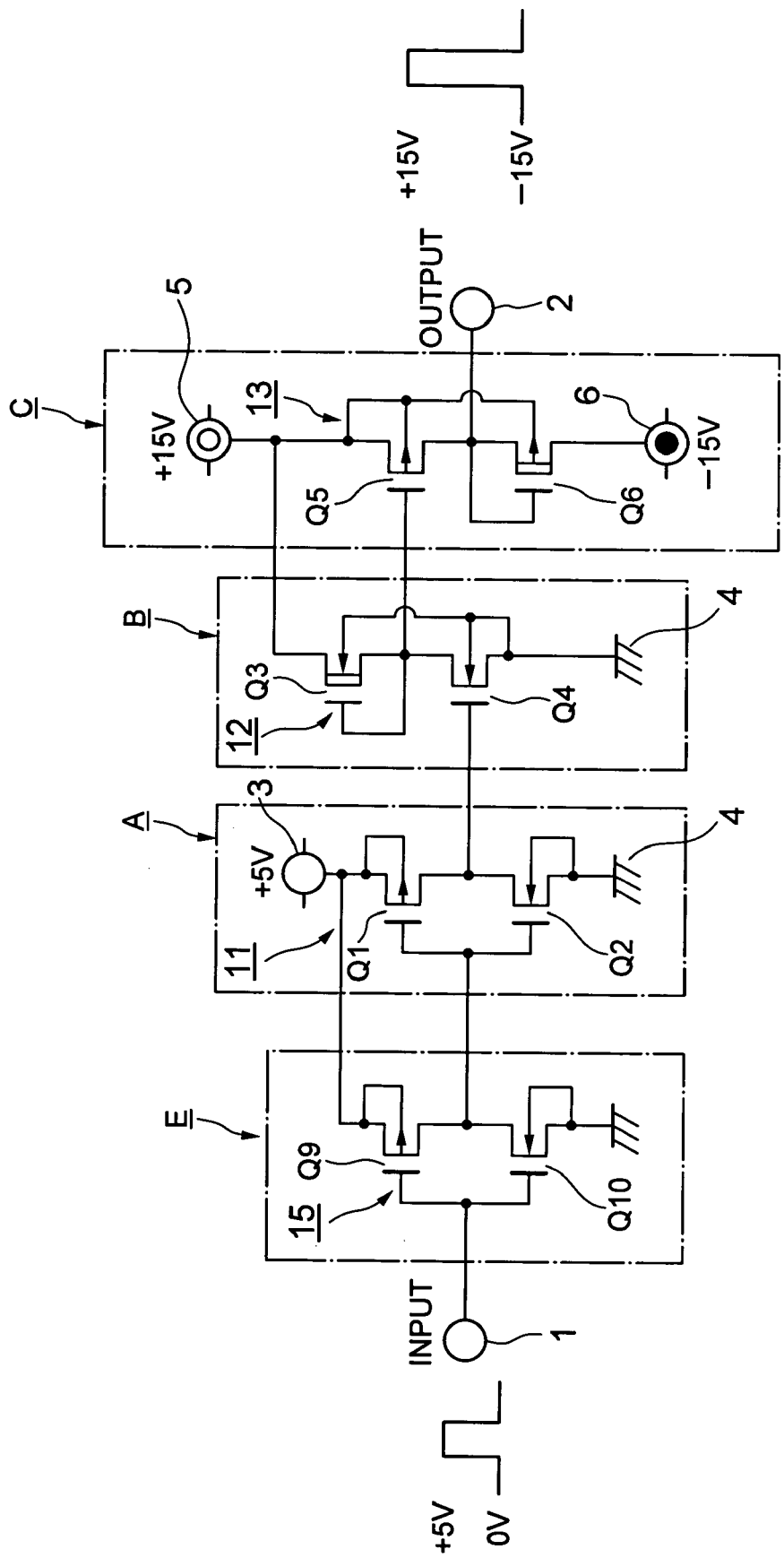
FIG. 8 is an electric circuit diagram of a level shift circuit according to a modification of the first embodiment.

FIG. 8 is an electric circuit diagram showing a level shift circuit according to a modification of the above described first embodiment. FIG. 9 is an electric circuit diagram showing a level shift circuit according to another modification of the above described first embodiment. In FIGS. 8 and 9, elements the same as or equivalent to the elements in FIG. 1 are designated by the same reference signs, and redundant descriptions thereof will be omitted.

What is different in the modification shown in FIG. 8 from the above-described first embodiment is that a circuit portion E composed of a CMOS inverter 15 having the same configuration as the CMOS inverter 11 of the first circuit portion A is provided between the first circuit portion A and the input terminal 1. A PMOS transistor Q9 and an NMOS transistor Q10 that constitute the CMOS inverter 15 correspond to the PMOS transistor Q1 and the NMOS transistor Q2 that constitute the CMOS inverter 11, respectively.

Figure 9:
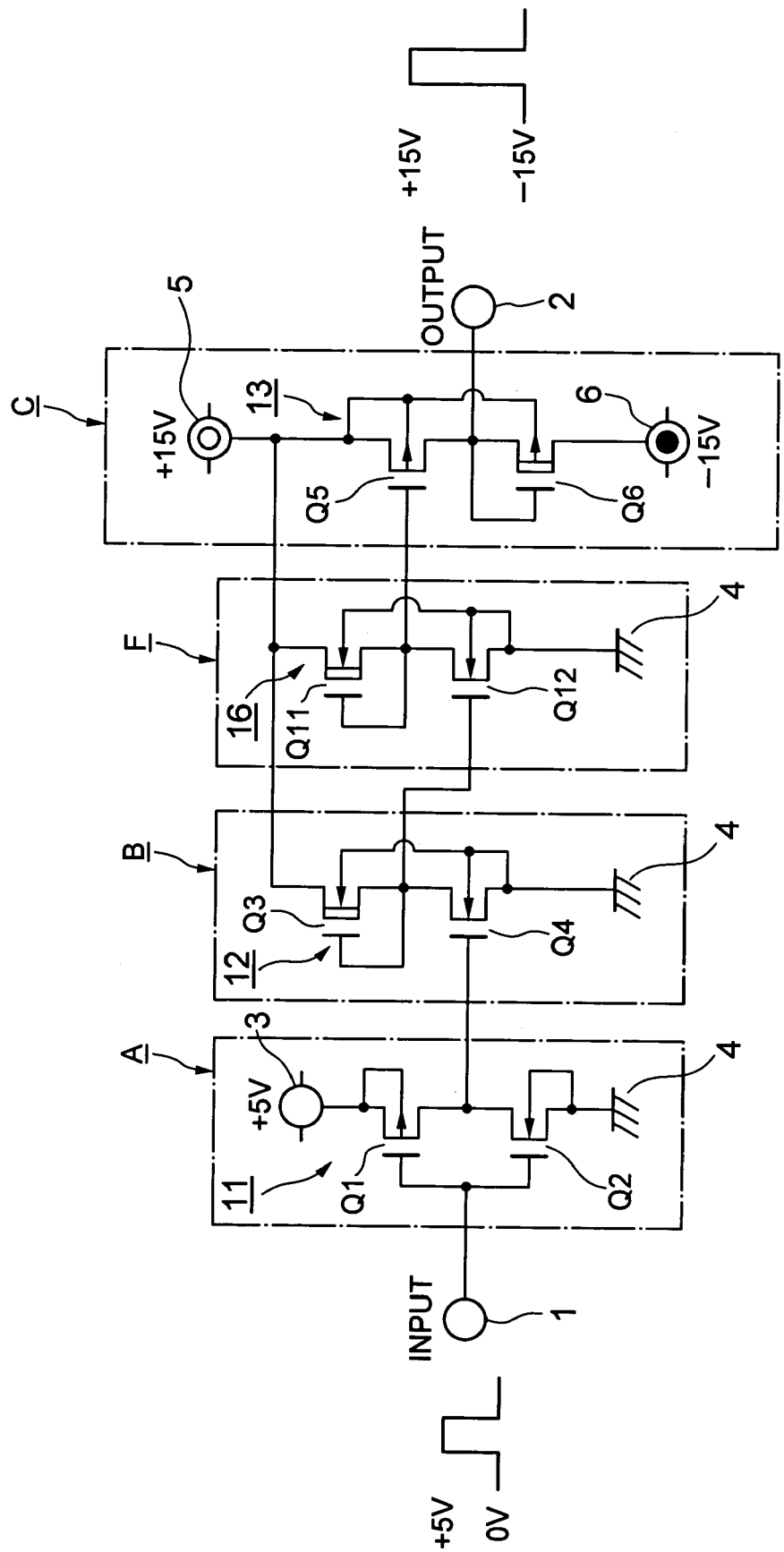
FIG. 9 is an electric circuit diagram of another level shift circuit according to a modification of the first embodiment.

What is different in the modification shown in FIG. 9 from the above-described first embodiment is that a circuit portion F composed of a single channel MOS inverter 16 having the same configuration as the single channel MOS inverter 12 of the second circuit portion B is provided between the second circuit portion B and the third circuit portion C. An NMOS transistor Q11 and an NMOS transistor Q12 that constitute the single channel MOS inverter 16 correspond to the NMOS transistor Q3 and the NMOS transistor Q4 that constitute the single channel MOS inverter 12, respectively.

According to the present invention, for example in the level shift circuit shown in FIG. 8 or FIG. 9, a circuit portion equivalent to the circuit portion D shown in FIG. 3 (that is, a circuit portion composed of a single channel MOS inverter having the same configuration as the single channel MOS inverter 13 of the third circuit portion C) may be provided between the third circuit portion C and the output terminal 2. In such cases, an output voltage having the logic state opposite to the logic state of the input voltage at the input terminal 1 is obtained at the output terminal 2. Besides this, advantageous effects same as those of the above described second embodiment are achieved.

Third Embodiment

Figure 10:
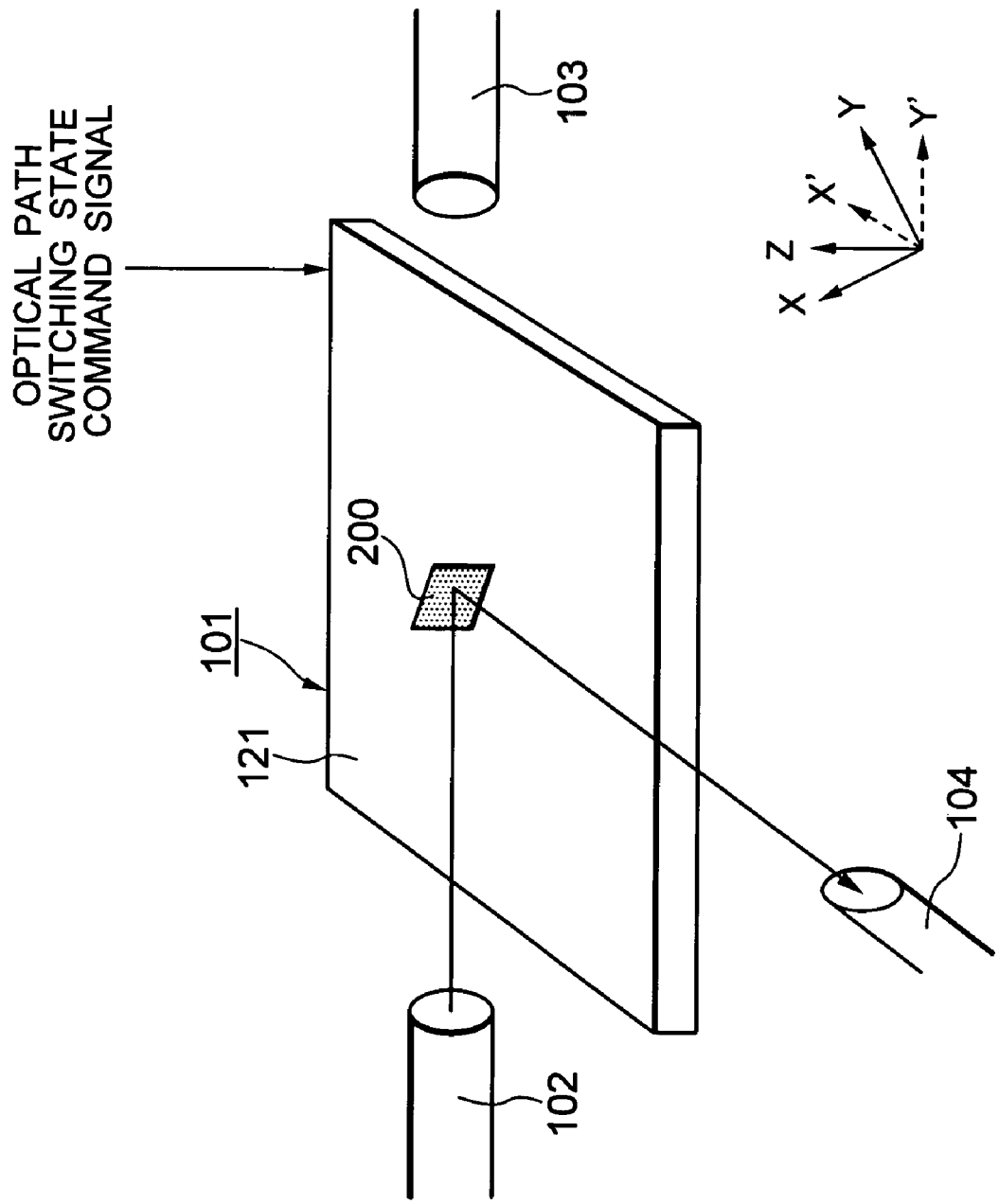
FIG. 10 schematically shows the basic structure of an optical switch system according to a third embodiment of the present invention.

FIG. 10 schematically shows an optical switch system according to a third embodiment of the present invention. To facilitate description, the X axis, the Y axis and the Z axis that are orthogonal to each other are defined as shown in FIG. 10. (This also applies to drawing that will be referred to later). In FIG. 10, the X' axis and the Y' axis are axes that are obtained respectively by rotating the X axis and the Y axis about the Z axis by 45 degrees. The surface of the substrate 121 of the device 101 is parallel to the X-Y plane. The plus (+) direction of the Z axis will sometimes be referred to as the upward direction and the minus direction of the Z axis will sometimes be referred to as the downward direction.

As shown in FIG. 10, the optical switch system according to this embodiment includes a device 101, an optical fiber for optical input 102 and an optical fiber for optical output 103 and an optical fiber for optical output 104.

The device 101 includes a substrate 121 and a mirror 200 provided on the substrate 121 as shown in FIG. 10. The optical fiber for optical input 102 is disposed in a plane parallel to the X-Y plane in such a way as to guide an incident light beam from one side of the substrate 121 along Y' axis direction to the Y' axis direction. The optical fiber for optical output 103 is disposed on the other side of the substrate 121 in such a way as to be opposed to the optical fiber for optical input 102, and on a plane parallel to the X-Y plane so that a light beam traveling in the Y' axis direction without being reflected by the mirror 200 of the device 101 is incident on it. The optical fiber for optical output 104 is disposed on a plane parallel to the X-Y plane so that a light beam having been reflected by the mirror 200 of the device 101 and traveling in the −X' direction is incident on it. The mirror 200 is disposed on the substrate 121 and adapted to be moved by a micro actuator 111 that will be described later along the Z axis so as to be brought to and retracted from the point of intersection of the exit optical path of the optical fiber for optical input 102 and the incidence optical path of the optical fiber for optical output 104. In this embodiment, the mirror 200 is oriented in such a way that its normal is parallel to the Y axis that forms an angle of 45 degrees with the Y' axis on a plane parallel to the X-Y plane. However, this angle may be changed fitly. When the orientation angle of the mirror 200 is changed, the orientation of the optical fiber for optical output 104 is to be set in accordance with that angle.

Figure 11:
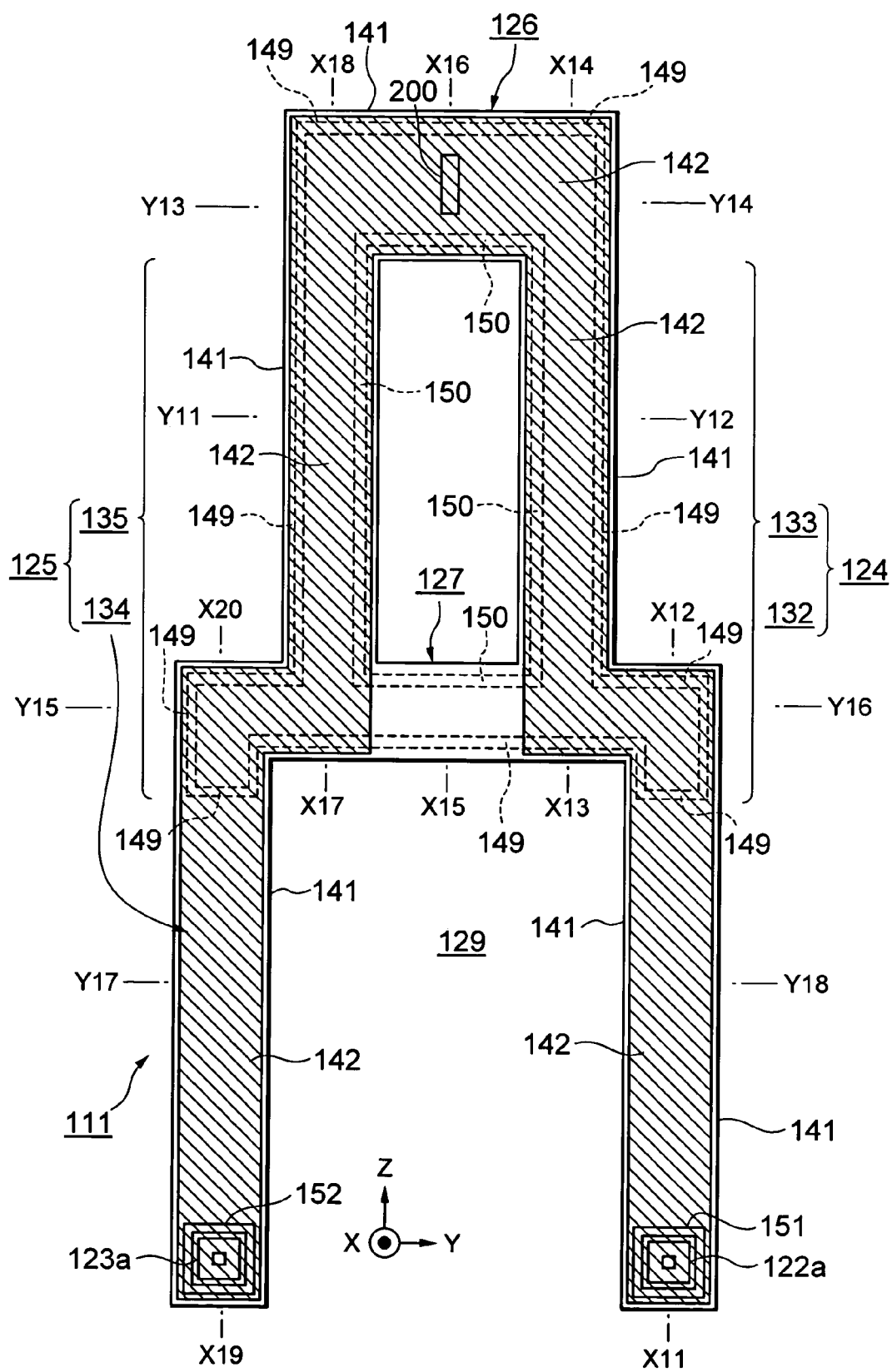
FIG. 11 is a schematic plan view schematically showing one optical switch equipped in a device used in the optical switch system according to the third embodiment of the present invention.
Figure 12:
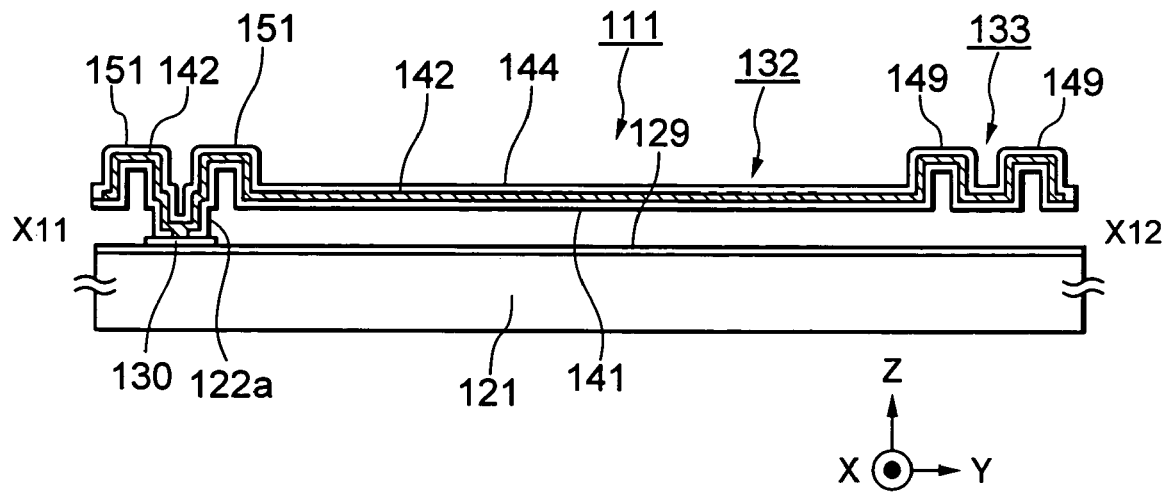
FIG. 12 is a schematic cross sectional view taken along line X11-X12 in FIG. 11.
Figure 13:
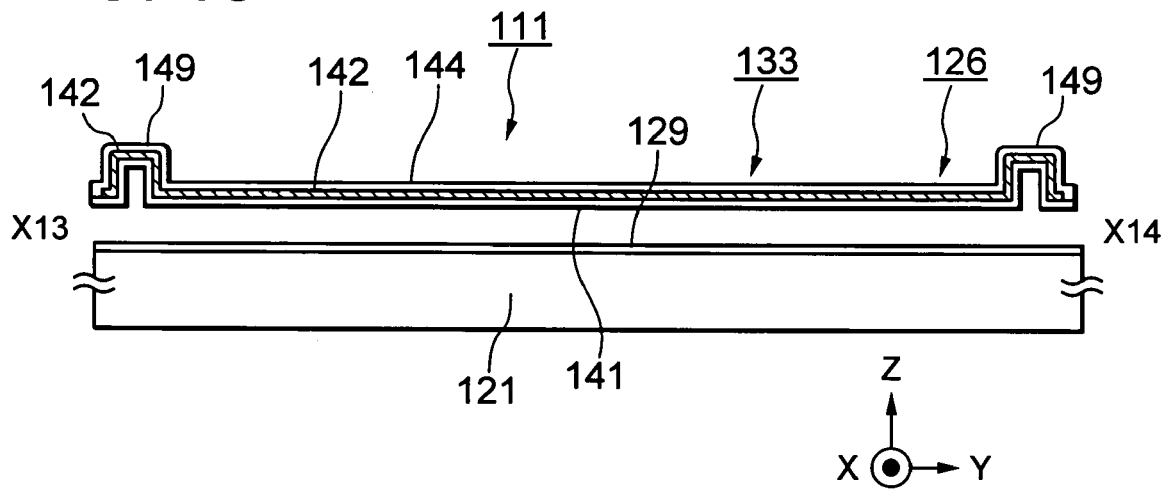
FIG. 13 is a schematic cross sectional view taken along line X13-X14 in FIG. 11.
Figure 14:
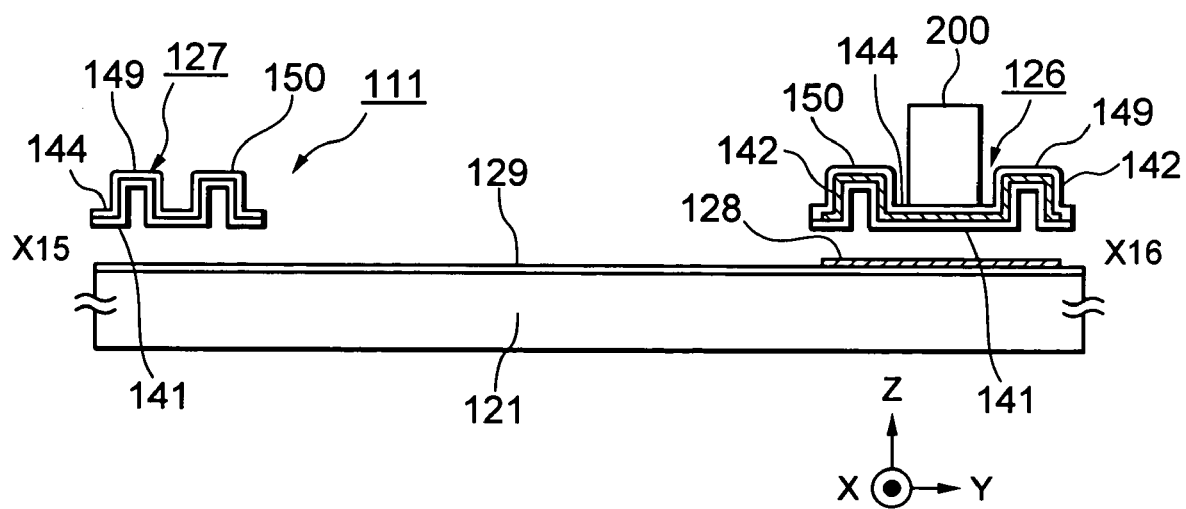
FIG. 14 is a schematic cross sectional view taken along line X15-X16 in FIG. 11.
Figure 15:
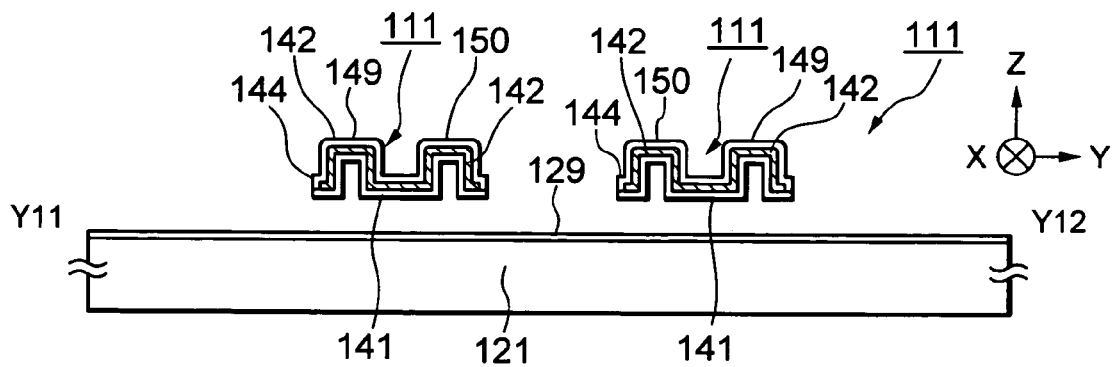
FIG. 15 is a schematic cross sectional view taken along line Y11-Y12 in FIG. 11.
Figure 16:
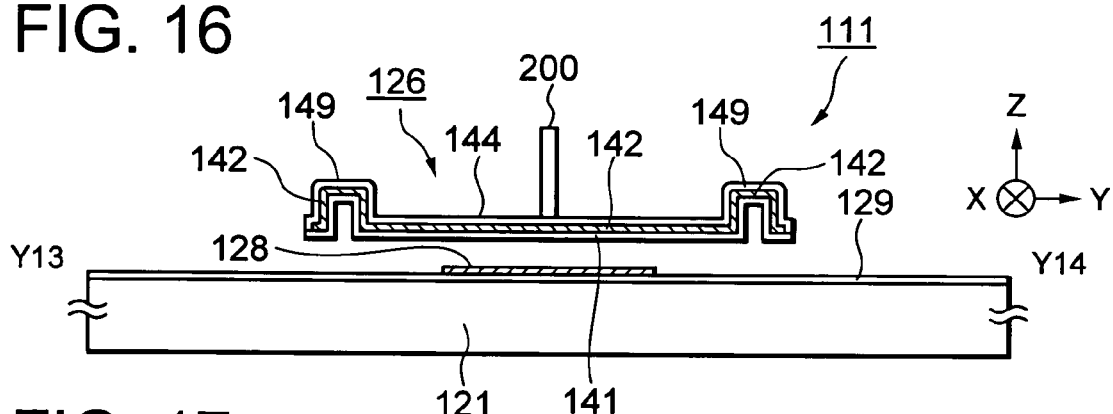
FIG. 16 is a schematic cross sectional view taken along line Y13-Y14 in FIG. 11.
Figure 17:
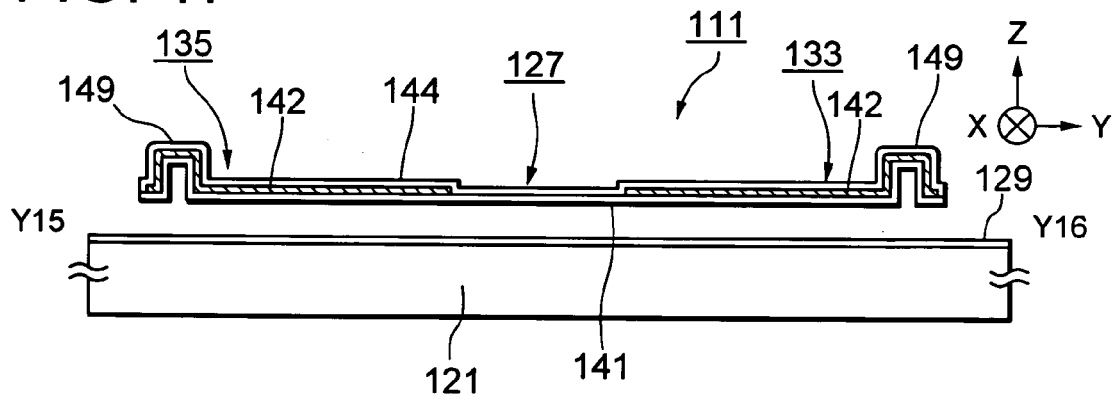
FIG. 17 is a schematic cross sectional view taken along line Y15-Y16 in FIG. 11.
Figure 18:
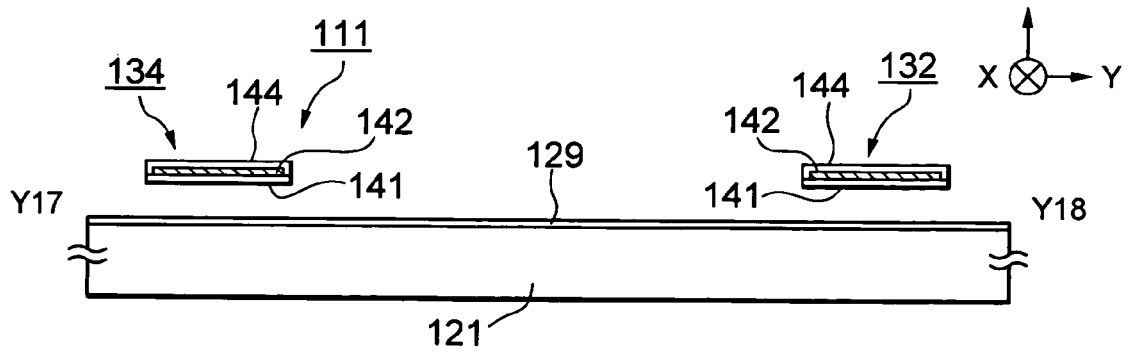
FIG. 18 is a schematic cross sectional view taken along line Y17-Y18 in FIG. 11.

Next, the structure of the optical switch equipped in the device 101 shown in FIG. 10 will be described with reference to FIGS. 11 to 18. FIG. 11 is a schematic plan view schematically showing one optical switch (that is, one micro actuator 111 and one optical mirror 200 driven by the micro actuator 111) equipped in the device 101 used in an optical switch system according to the third embodiment of the present invention. In FIG. 11, illustration of an SiN film 144 formed as a protection coat on the entire surface of the movable portion and the leg portions is omitted, the lines of the linear projecting portions 149, 150 that should have been naturally indicated by solid lines are indicated by broken lines, and an Al film 142 is hatched. FIG. 12 is a schematic cross sectional view taken along line X11-X12 in FIG. 11. A schematic cross sectional view taken along line X19-X20 in FIG. 11 will be the same as FIG. 12, though not shown in the drawings. FIG. 13 is a schematic cross sectional view taken along line X13-X14 in FIG. 11. A schematic cross sectional view taken along line X17-X18 in FIG. 11 will be the same as FIG. 13, though not shown in the drawings. FIG. 14 is a schematic cross sectional view taken along line X15-X16 in FIG. 11. FIG. 15 is a schematic cross sectional view taken along line Y11-Y12 in FIG. 11. FIG. 16 is a schematic cross sectional view taken along line Y13-Y14 in FIG. 11. FIG. 17 is a schematic cross sectional view taken along line Y15-Y16 in FIG. 11. FIG. 18 is a schematic cross sectional view taken along line Y17-Y18 in FIG. 11. In FIGS. 12 through 18, beam components 132 and 134 are illustrated in such a way as if they were not flexed with respect to the Z axis direction. But in reality, the beam components 132 and 134 are flexed, in the state in which no force is applied to the movable portion, toward the +Z direction by a stress of the films that constitute the beam components 132 and 134.

In this embodiment, the micro actuator 111 has a cantilevered beam structure.

The micro actuator 111 used in this embodiment includes a silicon substrate 121, leg portions 122a, 123a, two beam portions 124, 125 in the form of band plates extending mainly along the X axis direction in the plan view seen from the Z axis direction, a rectangular connecting portion 126 provided at the tip ends (namely, the free ends or the +X side ends) of the beam portions 124, 125 to mechanically connect them, a connecting portion 127 that mechanically connects the fixed ends of a beam component 133 constituting the beam portion 124 and a beam component 135 constituting the beam portion 125 for reinforcement, and a fixed electrode (the first electrode portion) 128.

The fixed end (that is, the −X side end) of the beam portion 124 is mechanically connected to the substrate 121 by means of a leg portion 122a having a rising portion rising from the substrate 121 with a wiring pattern 130 (not shown in FIG. 11) composed of an Al film formed on a insulating film 129 such as a silicon oxide film on the substrate 121 between. Similarly, the fixed end (that is, the −X side end) of the beam portion 125 is mechanically connected to the substrate 121 by means of a leg portion 123a having a rising portion rising from the substrate 121 with a wiring pattern (not shown) composed of an Al film formed on the insulating film 129 on the substrate 121 between. As described above, the free ends of the beam portions 124 and 125 are mechanically connected by the connecting portion 126, and the fixed ends of the beam components 132 and 134 are mechanically connected by the connecting potion 127. Thus, in this embodiment, the beam portions 124, 125 and the connecting portions 126, 127 constitute, as a whole, a movable portion having a cantilevered beam structure. In this embodiment, the substrate 121, the fixed electrode 128 and the insulating film 129 constitute the fixed portion.

The beam portion 124 includes two beam components 132, 133 mechanically connected in series along the X axis direction between the fixed end and the free end of the aforementioned movable portion. The beam component 132 is constructed in a band plate form extending along the X axis direction in a plan view seen from the Z axis direction. The beam component 133 is constructed in a band plate form basically extending along the X axis direction in the plan view seen from the Z axis direction but angled in the Y axis direction at the −X side position as shown in FIG. 11. The beam component 132 of the fixed end side (i.e., the −X side) is constructed as a leaf spring portion that can be flexed in the Z axis direction. On the other hand, the beam component 133 of the free end side (i.e., the +X side) is constructed as a substantially rigid portion having rigidity against flexure in the Z axis directions (i.e., the direction toward and away form the substrate 121) and other directions.

The beam component 132 is a laminated three-layered thin film composed of a lower SiN film 141, an intermediate Al film 142 and an upper SiN film 144 serving as a protection coat and is adapted to function as a leaf spring. The Al film 142 in the beam component 132 is used as a part of wiring to a movable electrode for generating electrostatic force.

The beam component 133 is constructed as a laminated three-layered thin film continuously extending from the beam component 132 and composed of the lower SiN film 141, the intermediate Al film 142 and the upper SiN film 144 serving as a protection coat. Linear projecting portions 149, 150 that will be described later are formed thereon to provide the aforementioned rigidity to the beam component 133.

In FIG. 12, the beam component 132 is illustrated in such a way as if it were not flexed with respect to the Z axis direction. But in reality, the beam component 132 is flexed upwardly (toward the direction opposite to the substrate 121, or the +Z direction) by a stress of the films 141, 142, 144, in the state in which a drive signal is not supplied. Such a flexed state can be realized by adjusting film forming conditions for the films 141, 142, 144 appropriately. On the other hand, the beam component 133 is not flexed materially in the Z axis direction regardless of whether a drive signal is supplied or not, and it always keeps a flat plate state without being flexed by the stress of the films 141, 142, 144 thanks to the aforementioned rigidity. In this way, when no force is applied on the beam portion 124, the beam component 132 and the beam component 133 are in different flexed/ unflexed states.

In this embodiment, the leg portion 122a is formed as a continuous extension of the SiN films 141, 144 and the Al film 142 that constitute the beam component 132. The Al film 142 is electrically connected to the wiring pattern 130 through an opening formed on the SiN film 141 at the leg portion 122a. In the upper part of the leg portion 122a, a linear projecting portion 151 is formed in a square shape in a plan view seen from the Z direction, in order to reinforce the strength of the leg portion 122a.

The beam portion 125 and the leg portion 123a have exactly the same structures as the above described beam portion 124 and the leg portion 122a respectively. The beam components 134 and 135 that constitute the beam portion 125 are equivalent to the beam components 132 and 133 that constitute the beam portion 124. In the upper part of the leg portion 123a, a linear projecting portion 152 equivalent to the linear projecting portion 151 is formed.

The connecting portion 127 is formed by a two-layered film composed of the SiN films 141, 144 that extend continuously from the beam components 133 and 135. The Al film 142 does not extend from the beam components 133 and 135 to the connecting portion 127, and no electric connection is provided in the connecting portion 127.

In this embodiment, in order to provide rigidity to all of the beam components 133 and 135 and the connecting portions 126 and 127, a linear projecting portion 149 that runs around along the outer circumference of all the area of these portions in the plan view and a linear projecting portion 150 that runs around along the inner circumference of the aforementioned area are formed as indicated by the broken lines in FIG. 11. The beam components 133 and 135 are reinforced by these linear projecting portions 149 and 150 to have rigidity. The beam components 133 and 135 are not flexed materially in the Z axis direction regardless of whether a drive signal is supplied or not, and they always keep a flat plate state without being flexed by the stress of the films 141, 142, 144 thanks to the aforementioned rigidity.

The connecting portion 126 is formed as a continuous extension of the SiN films 141, 144 and the Al film 142 that constitute the beam components 133 and 135. On the connecting portion 126, there is provided a mirror 200 made of a metal such as Au, Ni or the like as a driven member.

A part of the Al film 142 in the connecting portion 126 is used also as a movable electrode (the second electrode portion) for generating an electrostatic force. On the area on the substrate 121 that is opposed to this movable electrode is formed a fixed electrode 128 made of an Al film for generating electrostatic force. Though not shown in the drawing, the Al film that constitutes the fixed electrode 128 also extends as a wiring pattern, which is used in combination with the aforementioned wiring pattern 130 to make it possible to apply a voltage (a voltage for electrostatic force) between the fixed electrode 128 and the Al film 142 in the connecting portion 126 that is also used as the movable electrode.

As will be understood from the foregoing description, in this embodiment, the movable portion composed of the beam portions 124, 125 and the connecting portions 126, 127 is movable vertically (in the Z axis direction) relative to the fixed portion composed of the substrate 121, the fixed electrode 128 and the insulating film 129. Specifically, in this embodiment, the aforementioned movable portion is movable between the upper position back to which it is biased by a spring force of the beam components 132 and 134 that constitute a leaf spring and the lower position at which the connecting portion 126 is in contact with the fixed electrode 128. In the aforementioned upper position, when a voltage for generating an electrostatic force is applied between the fixed electrode 128 and the Al film 142 in the connecting portion 126 that is also serves as the movable electrode, the movable portion is moved by an electrostatic force generated between the electrodes to the lower position and clamped. If application of the voltage for generating electrostatic force is ceased when the movable portion is in this lower position, it is moved back to the upper position by a spring force of the beam components 132, 134.

Thus, in this embodiment, it is possible to bring the mirror 200 to an upper held position (that is, a position remote from the substrate 121) and a lower held position (that is, a position close to the substrate 121) by controlling the aforementioned voltage for generating electrostatic force. In this embodiment, such control is performed by a control circuit equipped in the device 101 in response to an externally-supplied optical path switching state command signal to realize the optical path switching state instructed by the optical path switching state command signal, as will be described later.

Figure 19A:
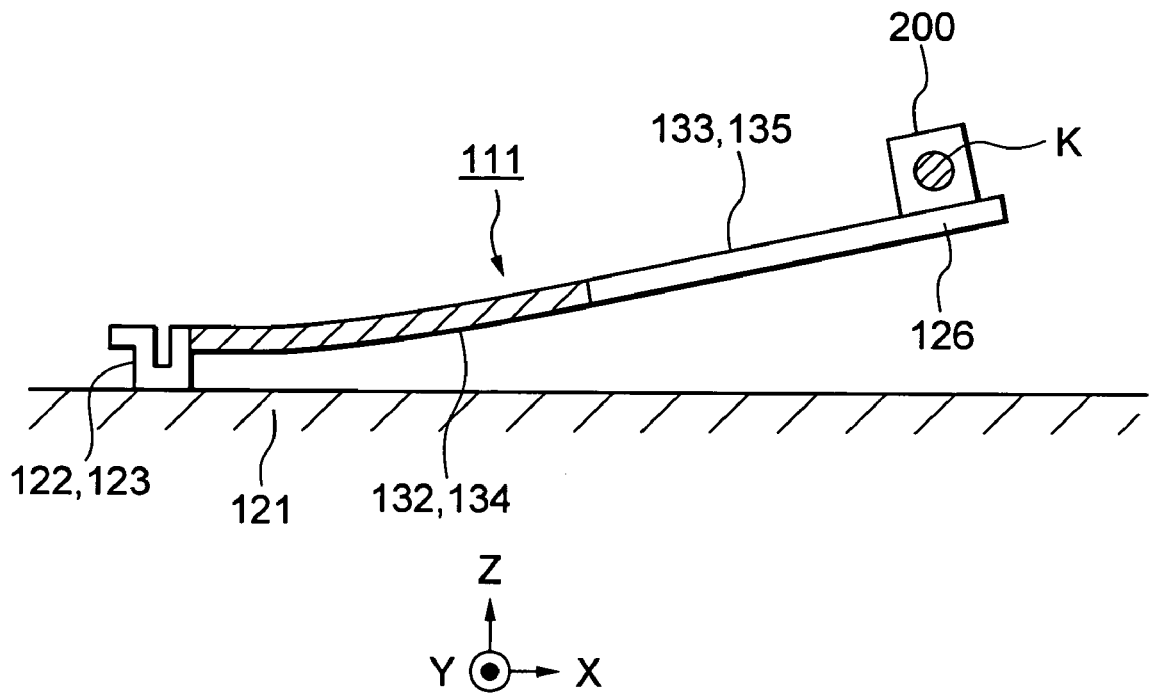
FIGS. 19A and 19B are schematic side views schematically illustrating optical path switching states realized by a mirror provided in a micro actuator in the first embodiment of the present invention.
Figure 19B:
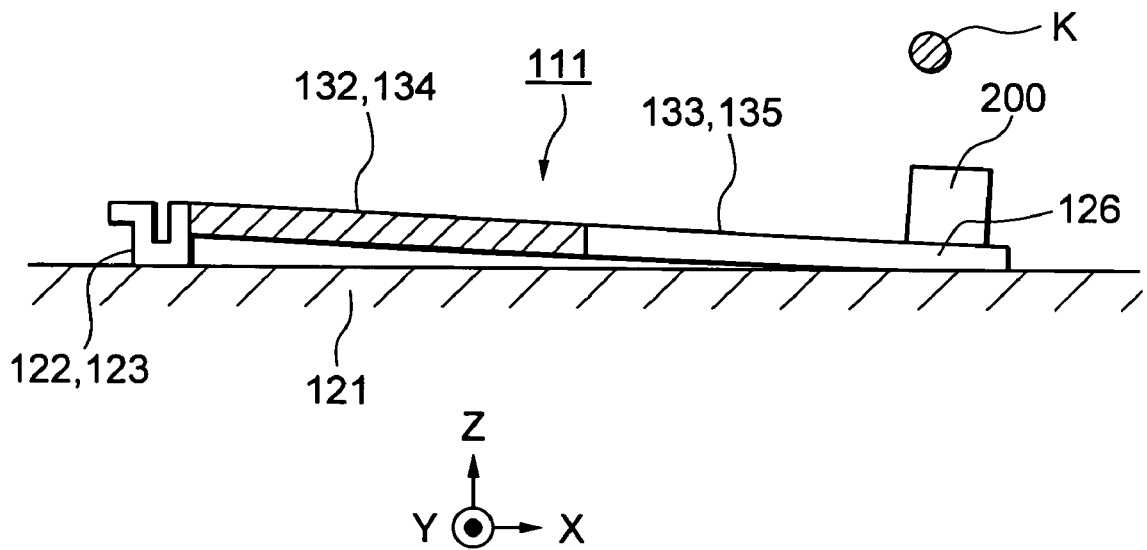

FIGS. 19A and 19B are schematic side views schematically showing the light switching states realized by the mirror 200 provided on the micro actuator 111. FIG. 19A shows the state in which the mirror 200 is retained in the upper position where it has been advanced onto the optical path, and FIG. 19B shows the state in which the mirror 200 is retained in the lower position where it has been retracted from the optical path. In FIGS. 19A and 19B, structures of various parts are illustrated in a greatly simplified manner. In FIGS. 19A and 19B, reference sign K designates the cross section of the optical path at the position of the advanced mirror 200.

As shown in FIG. 19A, in the state where the aforementioned electrostatic force is not applied, the beam components 132 and 134 are returned to the state flexed toward the +Z, direction by the stress of the films that constitute them, so that the mirror 200 is retained in the upper position. Thus, the mirror 200 is advanced onto the optical path K to reflect the light traveling on that optical path. To switch from this state to the state that allows the light traveling on the optical path to pass without being reflected by the mirror 200, it is sufficient to apply the aforementioned electrostatic force.

Figure 20:
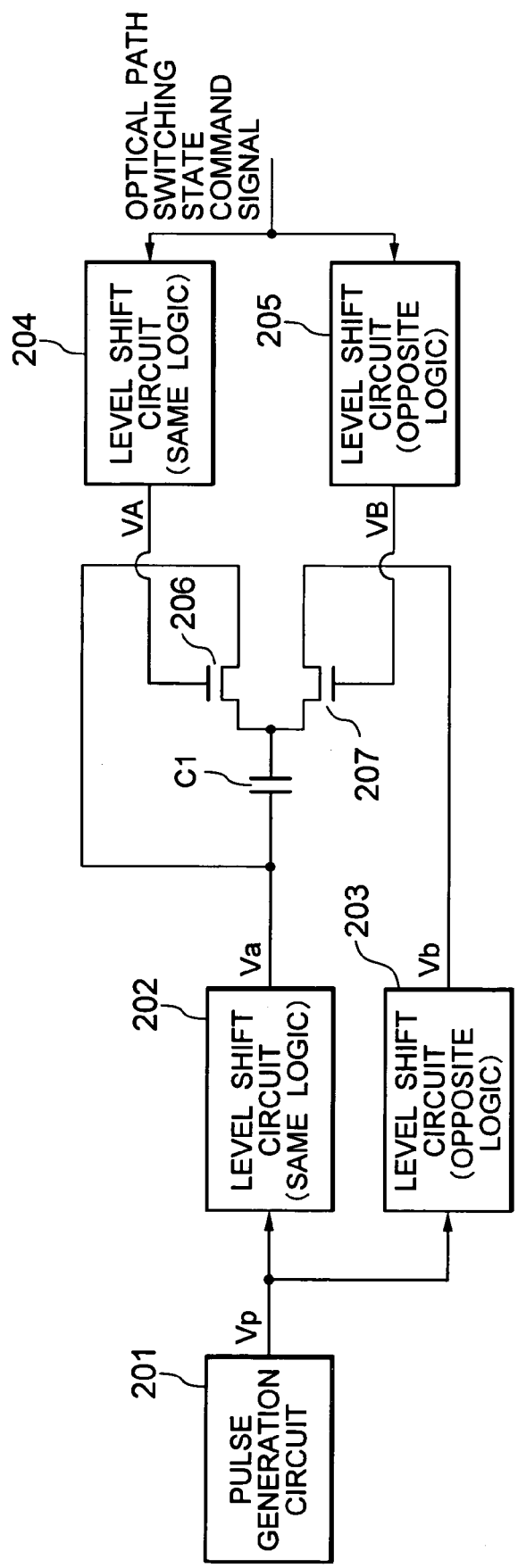
FIG. 20 is an electric circuit diagram of an optical switch and a control circuit for controlling the same in the first embodiment of the present invention.

FIG. 20 is an electric circuit diagram of the optical switch and a control circuit for controlling the same, both of which are provided in the device 101. One optical switch shown in FIGS. 11 to 18 can be regarded as one capacitor (equivalent to the capacitor formed by the fixed electrode 128 and the movable electrode (i.e., the Al film 142 in the connecting portion 126)) from the viewpoint of the electric circuit. In FIG. 20, the optical switch is represented as a capacitor C1. One electrode of the capacitor C1 is the fixed electrode and the other is the movable electrode.

The control circuit equipped in the device 101 is provided with a pulse generation circuit 201, level shift circuits 202 through 205 and MOS transistors 206 and 207 functioning as switching elements as shown in FIG. 20.

The pulse generation circuit 201 outputs a pulse signal Vp that alternately changes between 0 V and +5 V at a certain frequency as shown in FIG. 21A. The level shift circuit 202 is supplied, as the input signal, with the pulse signal Vp from the pulse generation circuit 201 and outputs a drive pulse signal Va of −15 V to +15 V having the logic state same as the pulse signal Vp as shown in FIG. 21B. This drive pulse signal Va is supplied to one of the electrode of the capacitor C1 and also to the drain of the MOS transistor 206. As the level shift circuit 202 in this embodiment, either one of the above described level shift circuit shown in FIGS. 3, 8 and 9 is used.

The level shift circuit 203 is supplied, as the input signal, with the pulse signal Vp from the pulse generation circuit 201 and outputs a drive pulse signal Vb of +15 V to −15 V having the logic state opposite to the pulse signal Vp. The drive pulse signal Vb is supplied to the drain of the MOS transistor 207 for supply to the other electrode of the capacitor C1. As the level shift circuit 203 in this embodiment, the above described level shift circuit shown in FIG. 1 is used.

In the case where the level shift circuit shown in FIG. 3 is used as the level shift circuit 202, a drive pulse signal Va can be obtained at its output terminal 2, and in addition, a drive pulse signal Vb is obtained from the connection point between the drain of the PMOS transistor Q5 and the source of the PMOS transistor Q6 of the level shift circuit shown in FIG. 1. Therefore, if the drive pulse signal Vb obtained from that connection point is used, the level shift circuit 203 may be eliminated.

In this embodiment, the external optical path switching state command signal becomes 0 V (or +5 V) when the switching state shown in FIG. 19A is ordered and becomes +5 V (or 0 V) when the switching state shown in FIG. 19B is ordered. In this way, the optical path switching state command signal assumes 0 V to 5 V. On the other hand, since the drive pulse signal Va of −15 V to +15 V is applied to one of the electrodes of the capacitor C1, and the other electrode of the capacitor C1 is connected to the source of the MOS transistors 206 and 207, the electric potential of the sources of the MOS transistors 206 and 207 can change within the range of −15 V to +15 V. Consequently, it is not possible to turning on/off the MOS transistors 206 and 207 appropriately by applying the optical path switching state command signal directly on the gate of the Mos transistors 206 and 207.

Hence level shift circuits 204 and 205 are provided in this embodiment so as to turn on/off the MOS transistors 206 and 207 appropriately. The level shift circuit 204 is supplied with the optical path switching state command signal as the input and outputs a switching control signal VA of −15 V to +15 V having the logic state same as the optical path switching state command signal for supply to the gate of the MOS transistor 206. The level shift circuit 205 is supplied with the optical path switching state command signal as the input, and outputs a switching control signal VB of +15 V to −15 V having the logic state opposite to the optical path switching state command signal for supply to the gate of the MOS transistor 207. Thus, the MOS transistors 206 and the MOS transistor 207 are adapted to be turned on/off complementarily in accordance with the optical path switching state command signal. Specifically, when the optical path switching state command signal orders the switching state shown in FIG. 19A, a state in which the MOS transistor 206 is turned on and the MOS transistor 207 is turned off is realized. On the other hand, when the optical path switching state command signal orders the switching state shown in FIG. 19B, a state in which the MOS transistor 206 is turned off and the MOS transistor 207 is turned on is realized.

Thus, when the optical path switching state command signal orders the switching state shown in FIG. 19A, the drive pulse signal Va is applied to both of the electrodes of the capacitor C1, and therefore the absolute value of the voltage applied between the two electrodes of the capacitor C1 is constantly 0 V despite that the drive pulse signal Va is an alternate pulse signal. Consequently, no electrostatic force acts between the movable electrode and the fixed electrode, and hence the state shown in FIG. 19A is realized. On the other hand, when the optical path switching state command signal orders the switching state shown in FIG. 19B, the drive pulse signal Va is applied to one of the electrodes of the capacitor C1, and the drive pulse signal Vb of the opposite phase is applied to the other electrode, and therefore the absolute value of the voltage applied between the two electrodes of the capacitor C1 is constantly 30 V despite that the drive pulse signals Va and Vb are alternate pulse signals. Consequently, an electrostatic force acts between the movable electrode and the fixed electrode, and hence the state shown in FIG. 19B is realized.

As per the above, in the case where both the electrodes of the capacitor C1 are driven by the alternate drive pulses Va and Vb, it is possible to avoid charge-up of the insulating member that supports the movable electrode, since the drive pulses do not have DC components. If charge-up occurs, the voltage of the charged-up insulating member is added to the applied voltage to cause a change in the potential difference between the fixed electrode and the movable electrode, which prevents normal operation. The possibility of occurrence of such a situation can be preferably eliminated.

According to this embodiment, since any one of the aforementioned level shift circuits shown in FIGS. 1, 3, 8 and 9 is used as each level shift circuit 202-205, downsizing of the device 101 and the entire optical switch system and cost reduction by simplification of the manufacturing process can be expected.

Here, the outline of an exemplary process for manufacturing the above-described device 101 will be described. First, the control circuit shown in FIG. 20 is produced on a silicon substrate 121 using a normal semiconductor manufacturing techniques. Thereafter, the device 101 can be produced by forming a micro actuator 111 and a mirror 200 by using semiconductor manufacturing techniques such as film formation, patterning, etching, and formation and removal of sacrifice layer. As disclosed in, for example, Japanese Patent Application Laid-Open No. 2001-42233 mentioned before, the mirror 200 can be produced by forming a recess corresponding to the mirror 200 on a resist, then causing a metal such as Au, Ni or the like for forming the mirror 200 to grow by electrolytic plating, and thereafter removing the resist.

Although the optical switch system according to this embodiment uses a single optical switch, the embodiment of the present invention may be modified into an optical switch using a two-dimensional optical switch. In this case, for example in FIG. 10, m optical fibers for optical input 102 arranged side by side, m optical fibers for optical output 103 arranged side by side and n optical fibers for optical output 104 arranged side by side are provided, and m×n mirrors 200 arranged in a two-dimensional matrix pattern are provided on the substrate 121 in such a way they can be advanced to and retracted from the respective points of intersection of the exit optical paths of the m optical fibers for optical input 102 and the incidence optical paths of the optical fibers for optical output 4104 by micro actuators 111 that will be described later, the micro actuators 111 and the mirrors 200 in the device 101 being provided on one micro actuator for one mirror basis. In this device, control circuits shown in FIG. 20 should be provided for the respective optical switches (i.e., pairs of the micro actuators 111 and the mirrors 200) on one control circuit for one optical switch basis. In this case, if the number m×n is large, the number of the terminals for supplying optical path switching state command signals also becomes large. To avoid this, it is preferred to modify the device, for example, in such a way as to provide an address decoder or a selection switch for selecting the X address and the Y address of each optical switch to make it possible to selectively activate the micro actuator 111 for the selected optical switch.

Similarly, it is also possible to provide an optical switch system using a two-dimensional optical switch by modifying the optical switch system according to the fourth embodiment that will be described in the following.

Fourth Embodiment

Figure 22:
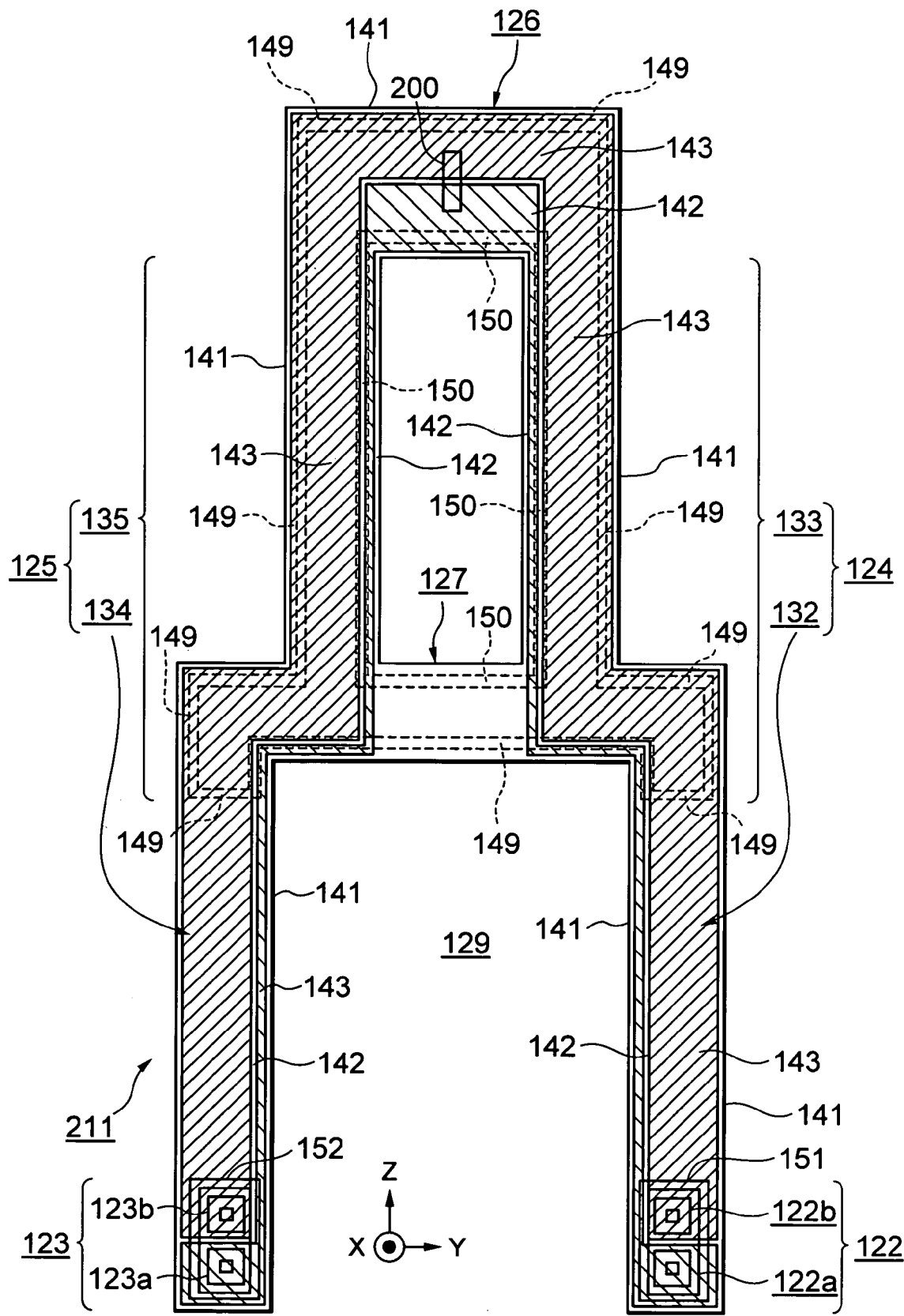
FIG. 22 is a schematic plan view schematically showing one optical switch equipped in a device used in an optical switch system according to a fourth embodiment of the present invention.

FIG. 22 is a schematic plan view similar to FIG. 11, schematically showing one optical switch (that is, one micro actuator 211 and one optical mirror 200 driven by the micro actuator 211) equipped in the device 101 used in an optical switch system according to the fourth embodiment of the present invention. In FIG. 22, illustration of an SiN film 144 formed as a protection coat on the entire surface of the movable portion and the leg portions is omitted, the lines of the linear projecting portions 149, 150 that should have been naturally indicated by solid lines are indicated by broken lines, and Al films 142 and 143 are hatched differently. In FIG. 22, elements the same as or equivalent to those in FIG. 11 or 18 are designated by the same reference signs, and redundant descriptions thereof will be omitted.

FIG. 23 is an electric circuit diagram of a control circuit provided in the device 101 used in the optical switching system according to the fourth embodiment of the present invention. In FIG. 23, the elements same as or equivalent to those in FIG. 20 are designated by the same reference signs, and redundant descriptions thereof will be omitted.

What is different in the optical switch system of this embodiment from the optical switch system according to the third embodiment is that the micro actuator 211 shown in FIG. 22 is provided in the device 101 in place of the micro actuator 111 shown in FIG. 11 or 18, that the control circuit shown in FIG. 23 is provided in the device 101 in place of the control circuit shown in FIG. 20, and that a magnetic field generating portion for generating a magnetic field that will be described later is additionally provided in the device 101.

The micro actuator 211 shown in FIG. 22 is different from the micro actuator 111 shown in FIG. 11 or 18 only in the following respect. The basic difference is that this embodiment is adapted to utilize not only the electrostatic force but also the Lorentz force, while the above described first embodiment is adapted to utilize only the electrostatic force.

In the micro actuator 211, the fixed end (that is, the −X side end) of the beam portion 124 is mechanically connected to the substrate 121 by means of a leg portion 122 composed of two individual leg portions 122a and 122b having rising portions rising from the substrate 121 respectively with two wiring patterns (not shown) composed of an Al film formed on the insulating film 129 such as a silicon oxide film on the substrate 121 between. Similarly, the fixed end (that is, the −X side end) of the beam portion 125 is mechanically connected to the substrate 121 by means of a leg portion 123 composed of two individual leg portions 123a and 123b having rising portions rising from the substrate 121 respectively with two wiring patterns (not shown) composed of an Al film formed on the insulating film 129 on the substrate 121 between.

The beam component 132 is a laminated three-layered (though two-layered in the space between Al film 142 and Al film 143) thin film composed of a lower SiN film 141, intermediate Al films 142, 143 and an upper SiN film 144 serving as a protection coat and is adapted to function as a leaf spring. The Al film 142 and the Al film 143 are formed at the same layer level, but spaced with respect to the Y axis direction with a little spacing as shown in FIG. 22 so as to be electrically separated. This is because the Al film 142 is used as wiring to the movable electrode for generating an electrostatic force, and the Al film 143 is used as wiring for forming a current path for generating a Lorentz force. Since the current supplied through the wiring for electrostatic force is little, while the current supplied through the wiring for Lorentz force is relatively large, the Al film 142 is formed to have a small width, and the Al film 143 is formed to have a large width to make the electric resistance of the wiring for Lorentz force small.

The beam component 133 is constructed as a laminated three-layered (though two-layered in the space between the Al film 142 and the Al film 143) thin film continuously extending from the beam component 132 and composed of the lower SiN film 141, the intermediate Al films 142, 143 and the upper SiN film 144 serving as a protection coat.

In this embodiment, the leg portion 122 is formed as a continuous extension of the SiN films 141, 144 and the Al films 142, 143 that constitute the beam component 132 and composed of the two individual leg portions 122a, 122b. The purpose of providing the two individual leg portions 122a and 122b in the leg portion 122 is to electrically connect the Al film 142 and the Al film 143 to the separate wiring patterns 130, 131 respectively while separating the wiring for electrostatic force and the wiring for Lorentz force. The Al film 142 is electrically connected to a predetermined wiring pattern through an opening formed on the SiN film 141 at the leg portion 122a. The Al film 143 is electrically connected to a predetermined wiring pattern through an opening formed on the SiN film 141 at the leg portion 122b. In the upper part of the leg portion 122, a linear projecting portion 151 is formed in a square shape surrounding both the individual leg portions 122a and 123b in the plane view seen from the Z direction in order to reinforce the strength of the leg portions 122.

The beam portion 125 and the leg portion 123 have exactly the same structures as the above described beam portion 124 and the leg portion 122 respectively. The beam components 134 and 135 that constitute the beam portion 125 are equivalent to the beam components 132 and 133 that constitute the beam portion 124. The individual leg portions 123a, 123b constituting the leg portion 123 are equivalent to the individual leg portions 122a, 122b that constitute the leg portion 122. In the upper part of the leg portion 123, a linear projecting portion 152 equivalent to the above described linear projecting portion 151 is formed.

The connecting portion 127 is formed by a two-layered film composed of the SiN films 141, 144 that extend continuously from the beam components 133 and 135. The Al films 142, 143 do not extend from the beam components 133 and 135 to the connecting portion 127, and no electric connection is provided in the connecting portion 127.

The connecting portion 126 is formed as a continuous extension of the SiN films 141, 144 and the Al films 142, 143 that constitute the beam components 133 and 135. On the connecting portion 126, there is provided a mirror 200 made of a metal such as Au, Ni or the like as a driven member.

In the connecting portion 126, the Al film 142 and the Al film 143 are separated as shown in FIG. 22, and a part of the Al film 142 in the connecting portion 126 is used also as a movable electrode for generating electrostatic force. On the area on the substrate 121 that is opposed to this movable electrode is formed a fixed electrode (not shown) made of an Al film for generating electrostatic force. Though not shown in the drawing the Al film that constitutes the fixed electrode also extends as a wiring pattern, which can apply a voltage (a voltage for electrostatic force) between the fixed electrode and the Al film 142 in the connecting portion 126 that is also used as the movable electrode.

On the other hand, as will be understood from the above description, a current path running from the wiring pattern (not shown) beneath the individual leg portion 122b of the leg portion 122 through the beam component 132, the beam component 133, the connecting portion 126, the beam component 135 and the beam component 134 to the wiring pattern (not shown) beneath the individual leg portion 123b of the leg portion 123 is formed by the Al film 143. In this current path, the current path running along the Y axis in the connecting portion 126 constitutes a portion for generating a Lorentz force directed to the Z axis direction when it is placed in a magnetic field directed to the X axis direction. In this embodiment, a magnet or the like serving as a magnetic field generating portion for generating such a magnetic field directed to the X axis direction is provided for example under the device 101, though not shown in the drawings. Therefore, when a current (current for Lorentz force) is caused to flow through the aforementioned current path, a Lorentz force (driving force) acts on the Al film 143 in the connecting portion 126 toward the Z direction. Whether the direction of this Lorentz force is the +Z direction or the −Z direction is determined depending on the direction of the current for Lorentz force.

Therefore, in this embodiment, it is possible to bring the mirror 200 to an upper held position (that is, a position remote from the substrate 121) and a lower held position (that is, a position close to the substrate 121) by controlling the aforementioned voltage between the electrodes and the current for Lorentz force. In this embodiment, such a control is performed as will be described later.

The control circuit shown in FIG. 23 differs from the control circuit shown in FIG. 20 only in the following respect. One optical switch shown in FIG. 22 can be regarded as one capacitor (equivalent to the capacitor formed by the fixed electrode and the movable electrode (i.e., the Al film 142 in the connecting portion 126)) and one coil (equivalent to the Al film 143 in the connecting portion 126) from the viewpoint of the electric circuit. In FIG. 23, the capacitor of the optical switch is designated by C1 in the same manner as in FIG. 20, and the coil of the optical switch is designated by L1.

In this embodiment, with addition of the coil L1, a drive force control signal generation circuit 251 and a current supply circuit 252 have been added. The drive force control signal generation circuit 251 supplies a Lorentz force control signal, which represents instruction to generate Lorentz force by +5 V (or 0 V) and instruction not to generate Lorenz force by 0 V (or +5 V), to the current supply circuit 252. The current supply circuit 252 supplies the coil L1 with a current for generating a downward Lorentz force as long as it receives a drive force control signal instructing to generate Lorentz force from the drive force control signal generation circuit 251.

In addition, the drive force control signal generation circuit 251 supplies an electrostatic force control signal, which represents instruction to generate electrostatic force by +5 V (or 0 V) and instruction not to generate electrostatic force by 0 V or (+5 V) to the level shift circuits 204 and 205 in place of the optical path switching state command signal.

In response to an externally-supplied optical path switching state command signal, the drive force control signal generation circuit 251 supplies the current supply circuit 232 with a Lorentz force control signal instructing to generate a Lorentz force throughout the period after receiving a command signal instructing to switch the mirror 200 from the upper held position to the lower position until the mirror 200 is brought to the lower position. The Lorentz force thus generated causes the mirror 200 to move from the upper position to the lower position. After the mirror 200 has moved to the lower position, the drive force control signal generation circuit 251 supplies an electrostatic force control signal instructing to generate electrostatic signal to the level shift circuits 204 and 205. The mirror 200 is retained at the lower position by the electrostatic force thus generated. In this way, the mirror 200 is latched in the lower position by the electrostatic force. After the mirror 200 is latched at the lower position by the electrostatic force, the drive force control signal generation circuit 251 supplies a Lorentz force control signal instructing not to generate Lorentz force to the current supply circuit 252.

After that, when the drive force control signal generation circuit 251 receives an optical path switching state command signal instructing to move the mirror 200 from the lower position to the upper position, it supplies an electrostatic force control signal instructing not to generate electrostatic force to the level shift circuits 204 and 205. In that case, since the drive force control signal generation circuit 251 have been supplying the current supply circuit 252 with a Lorentz force control signal instructing not to generate Lorentz force, neither electrostatic force nor Lorentz force is generated. Accordingly, the mirror 200 is moved to the upper position by a spring force of the movable portion and retained at that position.

According to this embodiment, since any one of the aforementioned level shift circuits shown in FIGS. 1, 3, 8 and 9 is used as each level shift circuit 202-205 as is the case with the above described third embodiment, downsizing of the device 101 and the entire optical switch system and cost reduction by simplification of the manufacturing process can be expected.

Although some embodiments of the present invention and their modifications have been described in the foregoing, the present invention is not limited to them. For example, the micro actuator apparatus according to the present invention can be used not only in an optical switch system but also other various applications. The level shift circuit according to the present invention can be used not only in a micro actuator apparatus but also other various applications.

What is claimed is:

1. A level shift circuit, comprising:
a circuit input and a circuit output;
a first circuit portion, comprising a CMOS inverter, connected to a first high potential power source and a first low potential power source and configured to produce, in response to an input signal being received at the circuit input, a first output voltage having an H level that is equal to or close to a respective voltage supplied by the first high potential power source and having an L level that is equal to or close to a respective voltage level supplied by the first low potential power source;
a second circuit portion connected to receive the first output voltage from the first circuit portion, the second circuit portion comprising a first single channel MOS inverter and being connected to a second high potential power source supplying a respective voltage that is higher than the respective voltages supplied by the first high potential power source and the first low potential power source, the second circuit portion producing, in response to receiving the first output voltage, a second output voltage having an H level that is equal to or close to the respective voltage level supplied by the second high potential power source and having an L level that is equal to or close to the respective voltage supplied by the first low potential power source; and
a third circuit portion connected to receive the second output voltage from the second circuit portion, the third circuit portion comprising a second single channel MOS inverter and being connected to the second high potential power source and to a second low potential power source, the second low potential power source supplying a respective voltage that is lower than the respective voltage supplied by the first low potential power source, the third circuit portion producing, in response to receiving the second output voltage, a third output voltage having an H level that is equal to or close to the respective voltage supplied by the second high potential power source and having an L level that is equal to or close to the respective voltage supplied by the second low potential power source, the third output voltage being delivered to the circuit output; wherein the first single channel MOS inverter comprises a respective NMOS transistor as a respective drive element; and the second single channel MOS inverter comprises a respective PMOS transistor as a respective drive element.

2. The level shift circuit of claim 1, further comprising a fourth circuit portion connected between the third circuit portion and the circuit output to receive the third output voltage from the third circuit portion and produce a fourth output voltage delivered to the circuit output, the fourth circuit portion comprising a respective inverter configured to cause the fourth output voltage to have a respective logic state similar to a respective logic state of the input signal.

3. The level shift circuit of claim 2, wherein:
the respective inverter in the fourth circuit portion comprises a third single channel MOS inverter having a respective PMOS transistor as a respective drive element;
the respective inverter in the fourth circuit portion is connected to the second high potential power source and to the second low potential power source; and
the fourth output voltage has an H level that is equal to or close to the respective voltage supplied by the second high potential power source and has an L level that is equal to or close to the respective voltage supplied by the second low potential power source.

4. The level shift circuit of claim 3, wherein the third single channel MOS inverter of the fourth circuit portion is configured the same as the second single channel MOS inverter of the third circuit portion.

5. The level shift circuit of claim 4, wherein:
the respective PMOS transistor of the third single channel MOS inverter is an enhancement type PMOS transistor serving as the respective drive element; and
the third single channel MOS inverter further comprises a depletion type PMOS transistor connected to the enhancement type PMOS transistor and serving as a load.

6. The level shift circuit of claim 1, wherein the circuit portions are provided on a semiconductor substrate.

7. The level shift circuit of claim 6, wherein:
the CMOS inverter of the first circuit portion comprises a respective NMOS transistor having a respective drain and source provided in a P-type region of the semiconductor substrate;
the respective NMOS transistor of the first single channel MOS inverter has a respective drain and source provided in the P-type region of the semiconductor substrate;
the CMOS inverter of the first circuit portion further comprises a respective PMOS transistor having a respective drain and source provided in a first N-type well of the semiconductor substrate; and
the respective PMOS transistor of the second single channel MOS inverter has a respective source and drain provided in a second N-type well, in the semiconductor substrate, that is different from the first N-type well in the semiconductor substrate.

8. The level shift circuit of claim 1, wherein:
the first single channel MOS inverter comprising the respective NMOS transistor as a drive element is connected to serve as an inverter in the second circuit portion; and
the second single channel MOS inverter comprising the respective PMOS transistor as a drive element is connected to serve as an inverter in the third circuit portion.

9. The level shift circuit of claim 1, further comprising an extra circuit portion situated between and connected to the circuit input and the first circuit portion so as to receive the input signal from the circuit input and provide a respective output voltage to the first circuit portion.

10. The level shift circuit of claim 9, wherein the extra circuit portion comprises a respective CMOS inverter that is configured similarly to the respective CMOS inverter of the first circuit portion.

11. The level shift circuit of claim 1, further comprising an extra circuit portion situated between and connected to the second circuit portion and the third circuit portion so as to receive the second output voltage from the second circuit portion and provide a respective output voltage to the third circuit portion.

12. The level shift circuit of claim 11, wherein the extra circuit portion comprises a respective single channel MOS inverter that is configured similarly to the first single channel MOS inverter of the second circuit portion.

13. The level shift circuit of claim 1, wherein:
the input signal ranges from 0 to +5 V; and
the third output voltage ranges from −15 V to +15 V.

14. An optical switch, comprising:
a substrate;
a movable member having a first end mounted to the substrate and a second end that is movable relative to the substrate from a first position to a second position and from the second position to the first position;
a mirror situated on the movable member, the mirror exhibiting a different reflection behavior to a beam of light, depending upon whether the movable member is in the first position or the second position;
a first electrode attached to the substrate;
a second electrode attached to the movable portion and situated relative to the first electrode such that, whenever at least one electrode is energized to produce a voltage difference between the first and second electrodes, a corresponding electrical force is established between the electrodes that causes the movable member and mirror to move relative to the substrate; and
at least one level shift circuit, as recited in claim 1, connected to the first and second electrodes and configured to produce, based on an input signal received at the circuit input and on a resulting output signal produced by the level shift circuit and delivered from the circuit output to at least one of the electrodes, a desired movement of the movable member and mirror relative to the substrate.

15. The optical switch of claim 14, further comprising:
at least one respective level shift circuit connected to each electrode; and
a pulse-generation circuit connected to the level shift circuits so as to provide respective input voltage signals to the respective circuit inputs of the level shift circuits.

16. The optical switch of claim 15, wherein:
at least a first of the level shift circuits produces a same-logic signal at its circuit output as the respective input voltage signal delivered by the pulse-generation circuit to the respective circuit input; and
at least a second of the level shift circuits produces an opposite-logic signal at its circuit output as the respective input voltage signal delivered by the pulse-generation circuit to the respective circuit input.

17. The optical switch of claim 14, wherein the electrical force established between the electrodes is at least one of an electrostatic force and a Lorentz force.

18. The optical switch of claim 14, configured as a one-dimensional optical switch.

19. The optical switch of claim 14, configured as a two-dimensional optical switch.

20. A micro actuator apparatus, comprising:
a micro actuator comprising a fixed portion and a movable portion that is movable relative to the fixed portion, the fixed portion including a first electrode and the movable portion including a second electrode situated relative to each other such that, whenever at least one electrode is energized to produce a voltage difference between the first and second electrodes, a corresponding electrical force is established between the electrodes; and
a control circuit having a circuit input and a circuit output, the circuit output being connected to the electrodes to produce, based on an input signal received at the circuit input, a desired movement of the movable portion relative to the fixed portion and thus a desired motion of the micro actuator, the control circuit comprising a level shift circuit that comprises (a) a first circuit portion, comprising a CMOS inverter, connected to a first high potential power source and a first low potential power source and configured to produce, in response to the input signal being received at the circuit input, a first output voltage having an H level that is equal to or close to a respective voltage supplied by the first high potential power source and having an L level that is equal to or close to a respective voltage level supplied by the first low potential power source; (b) a second circuit portion connected to receive the first output voltage from the first circuit portion, the second circuit portion comprising a first single channel MOS inverter and being connected to a second high potential power source supplying a respective voltage that is higher than the respective voltages supplied by the first high potential power source and the first low potential power source, the second circuit portion producing, in response to receiving the first output voltage, a second output voltage having an H level that is equal to or close to the respective voltage level supplied by the second high potential power source and having an L level that is equal to or close to the respective voltage supplied by the first low potential power source; and (c) a third circuit portion connected to receive the second output voltage from the second circuit portion, the third circuit portion comprising a second single channel MOS inverter and being connected to the second high potential power source and to a second low potential power source, the second low potential power source supplying a respective voltage that is lower than the respective voltage supplied by the first low potential power source, the third circuit portion producing, in response to receiving the second output voltage, a third output voltage having an H level that is equal to or close to the respective voltage supplied by the second high potential power source and having an L level that is equal to or close to the respective voltage supplied by the second low potential power source, the third output voltage being delivered to the circuit output, wherein the first single channel MOS inverter comprises a respective NMOS transistor as a respective drive element, and the second single channel MOS inverter comprises a respective PMOS transistor as a respective drive element.

21. The micro actuator apparatus of claim 20, wherein the level shift circuit further comprises a fourth circuit portion connected between the third circuit portion and the circuit output to receive the third output voltage from the third circuit portion and produce a fourth output voltage delivered to the circuit output, the fourth circuit portion comprising a respective inverter configured to cause the fourth output voltage to have a respective logic state opposite to a respective logic state of the input signal.

22. The micro actuator apparatus of claim 20, further comprising a mirror mounted to the movable portion.

23. The micro actuator apparatus of claim 22, wherein the movable portion is movable from a first position to a second position relative to the fixed portion in response to the control circuit producing an electrical force between the electrodes or not producing an electrical force, respectively; and the mirror exhibits a different reflection behavior to a beam of light, depending upon whether the movable portion is in the first position or the second position.

24. The micro actuator apparatus of claim 23, wherein the mirror is situated relative to the beam of light so as to exhibit an optical switch behavior as the movable portion moves from the first position to the second position and from the second position to the first position.

25. The micro actuator apparatus of claim 20, wherein the level shift circuit and the fixed portion are situated on a semiconductor substrate.

26. The micro actuator apparatus of claim 25, wherein:

the CMOS inverter of the first circuit portion comprises a respective NMOS transistor having a respective drain and source provided in a P-type region of the semiconductor substrate;

the respective NMOS transistor of the first single channel MOS inverter has a respective drain and source provided in the P-type region of the semiconductor substrate;

the CMOS inverter of the first circuit portion further comprises a respective PMOS transistor having a respective drain and source provided in a first N-type well of the semiconductor substrate; and the respective PMOS transistor of the second single channel MOS inverter has a respective source and drain provided in a second N-type well, in the semiconductor substrate, that is different from the first N-type well in the semiconductor substrate.

27. The micro actuator apparatus of claim 26, further comprising a mirror mounted to the movable portion.

28. The micro actuator apparatus of claim 26, wherein the movable portion is movable from a first position to a second position relative to the fixed portion in response to the control circuit producing an electrical force between the electrodes or not producing an electrical force, respectively; and the mirror exhibits a different reflection behavior to a beam of light, depending upon whether the movable portion is in the first position or the second position.

29. The micro actuator apparatus of claim 28, wherein the mirror is situated relative to the beam of light so as to exhibit an optical switch behavior as the movable portion moves from the first position to the second position and from the second position to the first position.

30. The micro actuator apparatus of claim 20, wherein:

the movable portion comprises a relatively flexible portion and a relatively rigid portion;

the relatively rigid portion is mounted to the relatively flexible portion, which in turn is mounted to the fixed portion, such that the movable portion extends in a cantilever manner relative to the fixed portion; and the second electrode is mounted to the relatively rigid portion.

31. The micro actuator apparatus of claim 30, wherein the relatively flexible portion provides a spring force that flexes the relatively flexible portion upwardly relative to the fixed portion whenever no electrical force is being produced between the electrodes.

32. The micro actuator apparatus of claim 20, wherein the electrical force established between the electrodes is at least one of an electrostatic force and a Lorentz force.

* * * * *